(12) United States Patent
Kawada

(10) Patent No.: US 6,678,944 B1
(45) Date of Patent: Jan. 20, 2004

(54) SYSTEM FOR MOUNTING ELECTRIC COMPONENTS ON A PRINTED-WIRING BOARD

(75) Inventor: Tosuke Kawada, Chiryu (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 0 days.

(21) Appl. No.: 09/524,565

(22) Filed: Mar. 13, 2000

(30) Foreign Application Priority Data

Apr. 1, 1999 (JP) .......................................... 11-095256

(51) Int. Cl.$^7$ ................................................ H05K 3/30
(52) U.S. Cl. ............................ 29/740; 29/739; 29/741; 29/743; 29/720; 29/832; 29/833; 29/834
(58) Field of Search .......................... 29/739, 740, 741, 29/743, 720, 832, 833, 834

(56) References Cited

U.S. PATENT DOCUMENTS

| | | | |
|---|---|---|---|
| 4,794,689 A | | 1/1989 | Makito et al. |
| 4,875,285 A | | 10/1989 | Haan et al. |
| RE35,027 E | | 8/1995 | Regard |
| 5,864,944 A | * | 2/1999 | Kashiwagi et al. ............ 29/833 |
| 5,878,484 A | * | 3/1999 | Araya et al. ................... 29/740 |
| 5,960,534 A | * | 10/1999 | Yazawa et al. ................ 29/743 |
| 6,276,051 B1 | * | 8/2001 | Asai et al. ..................... 29/740 |

FOREIGN PATENT DOCUMENTS

| | | |
|---|---|---|
| EP | 0691804 A | 1/1996 |
| JP | A-6-196546 | 7/1994 |
| JP | A-6-291490 | 10/1994 |

OTHER PUBLICATIONS

IBM Technical Disclosure Bulletin, vol. 30, No. 10, pp. 47–49, (Armonk, NY, USA).

* cited by examiner

Primary Examiner—Richard Chang
(74) Attorney, Agent, or Firm—Oliff & Berridge, PLC

(57) ABSTRACT

An electric-component mounting system, including a board supporting device, a movable member, a main moving device which moves the movable member, a rotatable body attached to the movable member, a rotatable-body rotating device which rotates the rotatable body, suction nozzles supported by the rotatable body along a circle whose center is located on an axis line of the rotatable body, such that each suction nozzle is not rotatable relative to the body and is movable relative to the body in a direction parallel to the axis line, an engaging member rotatable relative to the rotatable body about the axis line, movable relative to the body in the direction parallel to the axis line, and including a nozzle-engaging portion engageable with one suction nozzle, an engaging-member rotating device which rotates the engaging member to two rotation phases of the rotatable body at each of which the nozzle-engaging portion is engageable with one suction nozzle, an engaging-member moving device which moves the engaging member in the direction parallel to the axis line, so that the nozzle-engaging portion engages one suction nozzle and moves one suction nozzle toward the board supporting device, and a control device which controls the main moving device, the rotatable-body rotating device, the engaging-member rotating device, and the engaging-member moving device.

21 Claims, 16 Drawing Sheets

SYSTEM FOR MOUNTING ELECTRIC COMPONENTS ON A PRINTED-WIRING BOARD

BACKGROUND OF THE INVENTION

1. Field of the Invention

The present invention relates to a method and a system for mounting electric components on a printed-wiring board to produce printed circuit boards.

2. Related Art Statement

There are various manners of mounting electric components ("ECs") on a printed-wiring board. For example, Japanese Patent Document TOKU-KAI-HEI No. 6(1994)-196546 discloses an EC mounting system which includes a movable member which is movable to an arbitrary position on a horizontal plane; a main moving device which moves the movable member; a rotatable body which is attached to the movable member such that the rotatable body is rotatable about a vertical axis line; and a plurality of suction nozzles which are supported by the rotatable body such that the suction nozzles are provided along a circle whose center is located on the axis line of the rotatable body and such that each of the suction nozzles is not rotatable relative to the rotatable body and is movable relative to the body in a direction parallel to the axis line of the body. In the EC mounting system, owing to combination of the movement of the movable member and the rotation of the rotatable body, the suction nozzles sequentially suck and hold respective ECs, and sequentially mount the ECs on respective EC-mount locations on a printed-wiring board.

The above EC mounting system further includes an image taking device which is fixed in position. When the suction nozzles all holding the respective ECs pass by the image taking device, the image taking device take respective images of the ECs held by the suction nozzles, and the mounting system calculates, based on image data representing the taken images, position errors of the EC held by each of the suction nozzles. The position errors include respective position errors of the center of the EC in two directions perpendicular to each other on a horizontal plane, and a rotation-position error of the EC about a vertical axis line of the each suction nozzle. The position errors of the center of the EC are corrected by correcting respective distances of movement of the movable member in the two directions, and the rotation-position error is corrected by rotating the rotatable body. Thus, the EC is mounted with a correct rotation position at a correct EC-mount location on the printed-wiring board.

However, the above EC mounting system employs a plurality of engaging members corresponding to the plurality of suction nozzles, respectively, and revolves the engaging members with the corresponding suction nozzles, so that whichever rotation phase each of the suction nozzles may take, the corresponding engaging member can engage the each suction nozzle, thereby move the nozzle toward the printed-wiring board supported by a board supporting device, and mount the EC on the board. Thus, a great mass is moved with the movable member and accordingly it is difficult to start and/or stop the movable member so quickly, which leads to limiting the improvement of EC mounting efficiency.

The above problem that a great movement mass limits the improvement of EC mounting efficiency is encountered by not only the EC mounting system disclosed by the above-indicated Japanese Patent Document but also an EC mounting system of a type (hereinafter, referred to as the rotatable-body-moving-type EC mounting system) which includes a rotatable body and a plurality of suction nozzles supported by the rotatable body, and which moves the rotatable body along a plane perpendicular to an axis line of rotation of the body and thereby mounts ECs held by the suction nozzles on a printed-wiring board.

Moreover, there is an EC mounting system of a type which includes a rotatable body and a plurality of suction nozzles supported by the rotatable body, and which does not move the rotatable body but moves a printed-wiring board to mount ECs held by the suction nozzles on the board. In this EC mounting system, if a plurality of engaging members are employed and provided on the rotatable body, for moving the corresponding suction nozzles toward the printed-wiring board supported by a board supporting device, the rotatable body is subjected to an increased moment of inertia. Thus, it is difficult to start and/or stop the rotatable body so quickly, which leads to limiting the improvement of EC mounting efficiency.

SUMMARY OF THE INVENTION

The present invention provides an electric-component mounting method and an electric-component mounting system which have one or more of the technical features that are described below in respective paragraphs given parenthesized sequential numbers (1) to (22). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needled. However, the following technical features and the appropriate combinations thereof are just examples to which the present invention is by no means limited.

(1) According to a first feature of the present invention, there is provided a method of sequentially mounting, on a printed-wiring board supported by a board supporting device, a plurality of electric components which are sucked and held by respective ends of a plurality of suction nozzles which are supported by a rotatable body such that the suction nozzles are provided along a circle whose center is located on an axis line of the rotatable body and such that each of the suction nozzles is not rotatable relative to the rotatable body and is movable relative to the body in a direction parallel to the axis line of the body, the rotatable body being attached to a movable member which is movable to an arbitrary position on a movement plane parallel to the printed-wiring board supported by the board supporting device, such that the rotatable body is rotatable about the axis line thereof perpendicular to the movement plane, the method comprising the steps of sequentially positioning, owing to combination of the rotation of the rotatable body and the movement of the movable member, the respective electric components sucked and held by the suction nozzles, at respective positions opposed to respective predetermined locations on the printed-wiring board supported by the board supporting device, such that at least two of the electric components thus positioned take different rotation positions, rotating, concurrently with the rotation of the rotatable body, an engaging member common to the plurality of suction nozzles, to a position corresponding to one of the suction nozzles that holds the electric component to be mounted next, and moving, in the direction parallel to the axis line of the rotatable body, the engaging member to engage the one suction nozzle, so that the one suction nozzle is moved toward the board supporting device and the electric component held by the one suction nozzle is mounted on the printed-wiring board. In the present electric-component ("EC") mounting method, owing to combination of the rotation of the rotatable body and the movement of the movable member, the respective ECs sucked and held by the suction nozzles are sequentially positioned at respective positions opposed to respective predetermined locations on the printed-wiring board supported by the board supporting device, in such a manner that two or more of the suction nozzles holding the respective ECs are positioned at two or more different rotation phases of the rotatable body. The suction nozzles are not rotatable relative to the rotatable body. Therefore, if two or more of the suction nozzles are positioned at two or more different rotation phases of the rotatable body, the two or more suction nozzles have different rotation positions about respective axis lines thereof, and accordingly the respective ECs held by the two or more suction nozzles have different rotation positions. Therefore, if each of the two or more suction nozzles is moved toward the board supporting device, the respective ECs held by the two or more suction nozzles are mounted with the different rotation positions on the printed-wiring board. Though, in the present method, each of the two or more suction nozzles may be revolved to change the rotation position of the EC held by the each suction nozzle, the engaging member can be rotated to a rotation phase corresponding to one of the two or more suction nozzles that holds the EC to be mounted next, and can move the one suction nozzle toward the board supporting device. Thus, in the present method, the common or single engaging member is used to move each of the two or more suction nozzles positioned at the different rotation phases of the rotatable body, toward the board supporting device. Accordingly, the present method may be performed by a device which has a simplified construction, which contributes to decreasing the mass of a portion of the device that is moved with the movable member. Therefore, the movable member can be moved with high accuracy and at high speeds, which leads to improving the EC mounting efficiency. This effect is the most advantageous, in the case where each of the suction nozzles can be moved, at an arbitrary rotation phase of the rotatable body, toward the board supporting device. In the last case, the present method may be performed by the EC mounting system, disclosed by the above-indicated Japanese Patent Document, in which the plurality of suction nozzles are provided with the respective exclusive engaging members and the engaging members are revolved with the suction nozzles. However, the prior system has a complicated construction and a great mass, and accordingly it is difficult to move the movable member with high accuracy and at high speeds. In contrast, in the present method, the engaging member is commonly used for the plurality of suction nozzles, and accordingly each of the suction nozzles can be moved, at an arbitrary rotation phase, toward the board supporting device, without complicating the construction of the device. In addition, the mass of a portion of the device that is moved with the movable member can be reduced, and accordingly the EC mounting efficiency can be improved by moving the movable member with high accuracy and at high speeds.

(2) According to a second feature of the present invention that includes the first feature (1), the method further comprising simultaneously taking, with an image taking device, respective images of the electric components held by the suction nozzles, processing the taken image of the electric component held by each of the suction nozzles, to determine at least one position error of the electric component held by the each suction nozzle, and controlling the rotation of the rotatable body and the movement of the movable member to eliminate the position error. The at least one position error of the EC includes at least one of a rotation-position error of the EC and a position error of the center of the EC. The image taking device may be a surface-image taking device which has an image-take surface capable of simultaneously forming the respective images of the ECs thereon. The surface-image taking device may be moved with the rotatable body, according to the third feature (3) described below, or may be moved relative to the rotatable body. In the former case, the respective images of the ECs can be taken without stopping the movement of the rotatable body. In the latter case, the surface-image taking device may be fixed in position, or may be provided on a first member which is movable relative to a second member which is moved with the rotatable body. In either case, the images of the ECs can be taken without stopping the movement of the rotatable body, by, e.g., employing a short exposure time, but the images of the ECs may be taken in the state in which the rotatable body is stopped. The image taking device may be a so-called line sensor which includes a number of image-take elements arranged along a straight line extending in a direction intersecting a direction of movement of the rotatable body, and which is moved relative to the rotatable body. As the rotatable body is moved relative to the line sensor, the line sensor takes, at a regular interval of time, images of respective portions of the ECs. Since the ECs are moved while the line sensor repeatedly takes the images of respective portions of the ECs, the line sensor eventually take respective two-dimensional images of all the ECs. Irrespective of how the image taking device may be constructed, after all the suction nozzles suck and hold respective ECs, the image taking device simultaneously takes respective images of the ECs. Thus, the EC mounting efficiency can be improved as compared with the case where, each time one suction nozzle sucks and holds an EC, an image taking device takes an image of the EC, or the case where, while suction nozzles suck and hold respective ECs, an image taking device concurrently takes respective images of the ECs. For example, in the case where an EC-suck position where the suction nozzles suck and hold ECs from an EC supplying device is provided at a rotation phase of the rotatable body, the image taking device is disposed at an EC-image-take position provided at another rotation phase of rotatable body, and the image taking device is moved with the rotatable body, the image taking device can take respective images of the ECs while the ECs are sucked and/or mounted. In the last case, however, it is required that the rotatable body be so sized as to assure that the image taking device does not interfere with the EC supplying device when the ECs are sucked, or with the board supporting device when the ECs are mounted. Accordingly, the rotatable body is required to have a great diameter, which leads to increasing the mass thereof and thereby making it difficult to move the movable member with high accuracy and at high speeds. In contrast, in the present method, the images of ECs are simultaneously taken, and accordingly may be taken at an arbitrary time after all the suction nozzles have sucked and held respective ECs from the EC supplying device and before the ECs are mounted on the printed-wiring board, i.e., may be taken independent of the suction of ECs and/or the mounting of ECs. Thus, the present method does not need increasing the diameter of the rotatable body, and allows the image taking device to be provided without interfering with the EC supplying device or the board supporting device. Thus, the present method can improve the EC mounting efficiency by moving the movable member with high accuracy and at high speeds.

(3) According to a third feature of the present invention that includes the second feature (2), the step of taking the respective images of the electric components comprises taking, during a movement of the rotatable body caused by the movement of the movable member, the respective images of the electric components, with the image taking device which is being moved with the rotatable body. The image taking device may be provided on the movable member so as to be moved with the movable member, or may be provided on a member different from the movable member. In the latter case, an engaging/disengaging device may be employed to engage and disengage the different member with and from the movable member, so that while the image taking device takes the images of the ECs, the image taking device is moved with the rotatable body, and after the image taking device takes the images of the ECs, the different member is disengaged from the movable member, and additionally a returning device may be employed to return the different member to an initial position thereof after the different member is disengaged from the movable member. In the latter case, the present method may not need a reflecting device which causes the images of the ECs to be incident to the image taking device, and which is employed in the EC mounting system according to the twenty-first feature (21) described later. In the present method, the respective images of the ECs can be taken, without stopping the movement of the rotatable body, during a sufficiently long time when the rotatable body is moved toward the printed-wiring board after all the suction nozzles suck and hold the ECs. Thus, excellent images of the ECs can be obtained without sacrificing the EC mounting efficiency. The processing of the thus taken images may be carried out while the rotatable body is moved toward the printed-wiring board or, as needed, while the ECs are mounted on the board.

Each of the above-described first to third features (1) to (3) of the EC mounting method may be combined with one or more of the fourth to twenty-second features (4) to (22) of the EC mounting system that are described below.

(4) According to a fourth feature of the present invention, there is provided an electric-component mounting system, comprising a board supporting device which supports a printed-wiring board; a movable member which is movable to an arbitrary position on a movement plane parallel to the printed-wiring board supported by the board supporting device; a main moving device which moves the movable member; a rotatable body which is attached to the movable member such that the rotatable body is rotatable about an axis line thereof perpendicular to the movement plane; a rotatable-body rotating device which rotates the rotatable body about the axis line thereof; a plurality of suction nozzles which sucks and holds respective electric components and which are supported by the rotatable body such that the suction nozzles are provided along a circle whose center is located on the axis line of the rotatable body and such that each of the suction nozzles is not rotatable relative to the rotatable body and is movable relative to the body in a direction parallel to the axis line of tire body; an engaging member which is rotatable relative to the rotatable body about the axis line of the body and is movable relative to the body in the direction parallel to the axis line of the body, and which includes a nozzle-engaging portion which is engageable with one of the suction nozzles; an engaging-member rotating device which rotates the engaging member to at least two rotation phases of the rotatable body at each of which the nozzle-engaging portion of the engaging member is engageable with the one suction nozzle; an engaging-member moving device which moves the engaging member in the direction parallel to the axis line of the rotatable body, so that the nozzle-engaging portion of the engaging member engages the one suction nozzle and moves the one suction nozzle toward the board supporting device; and a control device which controls the main moving device, the rotatable-body rotating device, the engaging-member rotating device, and the engaging-member moving device. The present EC mounting system can carry out not only the EC mounting method according to the first feature (1), but also different EC mounting methods. The engaging-member rotating device may be one according to the Fifth feature (5) described below, i.e., one which can rotate the engaging member to an arbitrary rotation phase of the rotatable body about the axis line thereof, or may be one which can rotate the engaging member to two predetermined rotation phases of the rotatable body. In the latter case, at least two rotation phases may be assigned to each of the suction nozzles, and the engaging member is rotated to at least two rotation phases corresponding to those at least two rotation phases. The at least two rotation phases of one of the suction nozzles may be identical with, or different from, those of another or the other suction nozzle, or only one of the at least two rotation phases of one suction nozzle may be identical with only one of the at least two rotation phases of another or the other suction nozzle. The engaging-member moving device may be one which moves one suction nozzle toward the board supporting device and permits the one suction nozzle to be moved away from the same, as will be described in DETAILED DESCRIPTION OF THE PREFERRED EMBODIMENTS. A biasing device such as a spring may be employed to bias the one suction nozzle in a direction away from the board supporting device. In this case, the engaging-member moving device cooperates with the biasing device to provide a nozzle moving device which moves one suction nozzle toward, and away from, the board supporting device. Alternatively, the engaging-member moving device may be one which causes the engaging member Lo be engaged with one suction nozzle such that the engaging member is not movable relative to the one suction nozzle in each of the directions toward and away from the board supporting device, and which moves the one suction nozzle toward and away from the board supporting device. The engaging-member moving device moves one suction nozzle toward the board supporting device, and is moved with the rotatable body. For example, if, for changing the rotation position of the EC held by one suction nozzle, the rotatable body is rotated to change the rotation phase of the one suction nozzle, the engaging member is also rotated to a rotation phase where the engaging member can engage the one suction nozzle and thereby move the one nozzle toward the board supporting device. The engaging member may be one which is common to the plurality of suction nozzles and can move, toward the board supporting device, each of the suction nozzles that may, or may not, have been rotated to change the rotation phase thereof to change the rotation position of the EC held thereby. In the last case, the present system can move, with simple construction, each suction nozzle toward the board supporting device. In the case where the EC mounting system employs the engaging-member rotating device according to the fifth feature (5) and the control device according to the sixth feature (6), the system can change, by rotating the rotatable body, the current rotation position of the EC held by each of the suction nozzles, to any desired rotation position, and can eliminate the rotation-position error of the EC held by the each suction nozzle, as needed. In this case, as compared with the EC mounting system, disclosed in the above-indicated Japanese Patent Document, where the plurality of suction nozzles are provided with the respective exclusive engaging members, the present EC mounting system enjoys a simplified construction and a decreased mass, and accordingly can quickly mount the ECs on the printed-wiring board while changing the respective rotation positions of the ECs held by the suction nozzles. It is desirable that the engaging member he moved toward the ECs or the printed-wiring board by the engaging-member moving device in the same manner both when the ECs are sucked and held by the suction nozzles and when the ECs held by the nozzles are mounted on the printed-wiring board.

(5) According to a fifth feature of the present invention that includes the fourth feature (4), the engaging-member rotating device comprises a rotating device which can rotate the engaging member to an arbitrary rotation phase of the rotatable body about the axis line of the body.

(6) According to a sixth feature of the present invention that includes the fifth feature (5), the control device comprises a positioning control portion which can sequentially position, owing to combination of the rotation of the rotatable body by the rotatable-body rotating device and the movement of the movable member by the main moving device, the respective electric components sucked and held by the suction nozzles, at respective positions opposed to respective predetermined locations on the printed-wiring board supported by the board supporting device, such that each of the electric components thus positioned takes an arbitrary rotation position; and a mounting control portion which controls the engaging-member rotating device to rotate, concurrently with the rotation of the rotatable body, the engaging member to a rotation phase corresponding to the one of the suction nozzles that holds the electric component to be mounted next, which controls the engaging-member moving device to move, in the direction parallel to the axis line of the rotatable body, the engaging member to engage the one suction nozzle, so that the one suction nozzle is moved toward the board supporting device and the electric component held by the one suction nozzle is mounted on the printed-wiring board.

(7) According to a seventh feature of the present invention, there is provided an electric-component mounting system, comprising a board supporting device which supports a printed-wiring board; a rotatable body which is rotatable about an axis line thereof perpendicular to the printed-wiring board supported by the board supporting device; a main moving device which moves at least one of the rotatable body and the board supporting device, relative to the other of the rotatable body and the board supporting device, to an arbitrary position on a movement plane parallel to the printed-wiring board supported by the board supporting device; a rotatable-body rotating device which rotates the rotatable body about the axis line thereof; a plurality of suction nozzles which sucks and holds respective electric components and which are supported by the rotatable body such that the suction nozzles are provided along a first circle whose center is located on the axis line of the rotatable body and such that each of the suction nozzles is movable relative to the body in a direction parallel to the axis line of the body; a nozzle moving device which moves each of the suction nozzles toward, and away from, the board supporting device; and a control device which controls the main moving device, the rotatable-body rotating device, and the nozzle moving device, the nozzle moving device comprising an engaging member which is rotatable relative to the rotatable body about the axis line of the body and is movable relative to the body in the direction parallel to the axis line of the body, and which includes a nozzle-engaging portion which is engageable with one of the suction nozzles, an engaging-member rotating device which rotates the engaging member to at least two rotation phases of the rotatable body at each of which the nozzle-engaging portion of the engaging member is engageable with the one suction nozzle, and an engaging-member moving device which moves the engaging member in the direction parallel to the axis line of the rotatable body, so that the nozzle-engaging portion of the engaging member engages the one suction nozzle and moves the one suction nozzle toward the board supporting device. In the present EC mounting system, the rotatable body may be rotated to change the rotation position of an EC at the time when the EC is sucked and held by one suction nozzle, correct a rotation-position error of an EC held by one suction nozzle, and/or to move an EC held by one suction nozzle to a rotation phase where the EC is the nearest to the corresponding EC-mount position on the printed-wiring board so as to shorten a distance of relative movement of the rotatable body (i.e., the one suction nozzle) and the board supporting device. Anyhow, the engaging member is rotated by the engaging-member rotating device to a rotation phase corresponding to the one suction nozzle, and moves the one nozzle toward the board supporting device. According to the seventh feature (7), the suction nozzles have only to be provided along a circle whose center is located on the axis line of the rotatable body and be each movable relative to the body in a direction parallel to the axis line of the body. Therefore, each suction nozzle may, or may not, be rotatable relative to the rotatable body. In the former case, one or more nozzle rotating devices is or are employed to rotate the suction nozzles relative to the rotatable body. A plurality of nozzle rotating devices may be employed for the plurality of suction nozzles, respectively. In this case, the plurality of nozzle rotating devices may share a portion common to the plurality of suction nozzles. The main moving device has only to move at least one of the rotatable body and the board supporting device relative to the other of the rotatable body and the board supporting device, to an arbitrary position on a movement plane parallel to the printed-wiring board (i.e., a major surface thereof) supported by the board supporting device. Accordingly, the main moving device may be one which moves the rotatable body and the board supporting device in two directions, respectively, which are perpendicular to each other; one which moves only the board supporting device in two directions perpendicular to each other; or one which moves only the rotatable body in two directions perpendicular to each other. The EC mounting system according to the fourth feature (4) corresponds to the EC mounting system according to the seventh feature (7) and wherein the suction nozzles are not rotatable relative to the rotatable body and the main moving device moves only the rotatable body along the movement plane. Each of the rotatable-body rotating device and the engaging-member rotating device may be one which rotates the rotatable body or the engaging member to only one or more predetermined rotation phases, or one which rotates the rotatable body or the engaging member to an arbitrary rotation phase.

(8) According to an eighth feature of the present invention that includes the seventh feature (7), the engaging-member rotating device comprises a rotating device which can rotate the engaging member to an arbitrary rotation phase of the rotatable body about the axis line of the body.

(9) According to a ninth feature of the present invention that includes any one of the fourth to eighth features (4) to (8), the system further comprises a plurality of switch valve devices which are supported by the rotatable body, which correspond to the plurality of suction nozzles, respectively, and each of which comprises at least one switch valve including at least one engageable portion, wherein the engaging member includes at least one valve-engaging portion which is engageable with the at least one engageable portion of the switch valve to switch the switch valve, and wherein the engaging-member rotating device rotates the engaging member to move the valve-engaging portion of the engaging member to a position corresponding to the engageable portion of the switch valve of one of the switch valve devices, and the engaging-member moving device moves the engaging member so that the valve-engaging portion of the engaging member engages the engageable portion of the switch valve of the one switch valve device and thereby switches the one switch valve device. Each of the switch valve devices may be constructed in various manners. For example, each switch valve device may include a plurality of switch valves, as described in DETAILED DESCRIPTION OF THE PREFERRED EMBODIMENTS, or a single switch valve. Even in the latter case, each switch valve device can allow a negative pressure to be supplied to a corresponding suction nozzle and stop the supplying of negative pressure (and additionally allow a positive pressure to be supplied to the corresponding suction nozzle and stop the supplying of positive pressure, as needed). One switch valve may include a plurality of engageable portions, as described in DETAILED DESCRIPTION OF THE PREFERRED EMBODIMENTS, or a single engageable portion. Even in the latter case, the switch valve can perform its switching operation. For example, the valve-engaging portion of the engaging member and the engageable portion of the switch valve are so formed that the motion of the valve-engaging portion in each of opposite directions is transmitted to the engageable portion. The engaging member may include the same number of valve-engaging portion or portions as the number of switch valve or valves of each switch valve device, so that the valve-engaging portion or portions corresponds or correspond to the switch valve or valves, respectively. However, this is not essentially required. For example, the engaging member may include a plurality of valve-engaging portions which correspond to a single switch valve and each of which is selectively engageable with the single switch valve to place the same in a corresponding one of a plurality of switchable states. Alternatively, the engaging member may include a single valve-engaging portion which is selectively engageable with each one of respective engageable portions of a plurality of switch valves of each switch valve device. In the present EC mounting system, the plurality of valve switch devices are employed for the plurality of suction nozzles, respectively, and each of the valve switch devices is switched to supply at least the negative pressure to a corresponding one of the suction nozzles and stop the supplying of negative pressure. The respective switching actions of the switch valve devices are performed by the common engaging member. Thus, the present system can allow and stop, with a simple construction, the supplying of negative pressure (and additionally the supplying of positive pressure, as needed) to each suction nozzle.

(10) According to a tenth feature of the present invention that includes the ninth feature (9), each of the switch valve devices comprises a plurality of switch valves each of which includes the at least one engageable portion, and wherein the valve-engaging portion of the engaging member is selectively engageable, owing to a relative rotation of the engaging member and the rotatable body, with each of the respective engageable portions of the switch valves of the each switch valve device. When ECs are sucked and held by the suction nozzles, the engaging member is rotated to a rotation phase which corresponds to one suction nozzle to be moved thereby toward an EC and simultaneously corresponds to the engageable portion of one of the plurality of switch valves of one switch valve device corresponding to the one suction nozzle, and moves the one suction nozzle toward the EC while switching the one switch valve. When ECs are mounted on the printed-wiring board ("PWB"), the engaging member is rotated to a rotation phase which corresponds to one suction nozzle to be moved thereby toward the PWB and simultaneously corresponds to the engageable portion of one of the plurality of switch valves of one switch valve device corresponding to the one suction nozzle, and moves the one suction nozzle toward the PWB while switching the one switch valve. Thus, the engaging member is rotated, for each of the suction nozzles, to each of a plurality of rotation phases at each of which the engaging member is engageable with the engageable portion of a corresponding one of the plurality of switch valves of one switch valve device corresponding to the each suction nozzle, and moves the each suction nozzle toward the EC or the PWB. That is, the single engaging member can switch the plurality of switch valve devices. The tenth feature (10) may be employed independent of any of the fourth to eighth features (4) to (8). That is, the tenth feature (1) may be generally or widely employed in a switch valve which is switchable by engagement thereof with an engaging member and which controls the supplying of negative and/or positive pressure to a suction nozzle.

(11) According to an eleventh feature of the present invention that includes the tenth feature (10), the system further comprises an electric-component supplying device which supplies the electric components to the suction nozzles, wherein the switch valves of the each switch valve device comprise a first switch valve and a second switch valve each of which includes the at least one engageable portion, wherein owing to a movement of the engaging member to engage one of the suction nozzles that corresponds to the each switch valve device and thereby move the one suction nozzle toward the electric-component supplying device, the valve-engaging portion of the engaging member engages the engageable portion of the first switch valve, so that in a terminal portion of the movement of the engaging member, the first switch valve is switched to a state in which the first switch valve permits supplying of a negative pressure to the one suction nozzle, and wherein owing to a movement of the engaging member to engage the one suction nozzle and thereby move the one suction nozzle toward the board supporting device, the valve-engaging portion of the engaging member engages the engageable portion of the second switch valve, so that in a terminal portion of the movement of the engaging member, the second switch valve is switched to a state in which the second switch valve stops the supplying of the negative pressure to the one suction nozzle. When ECs are sucked and held by the suction nozzles, the valve-engaging portion of the engaging member engages the engageable portion of the first switch valve, so that the negative pressure is supplied to one suction nozzle and the one suction nozzle sucks and holds an EC. When ECs are mounted on the PWB, the valve-engaging portion of the engaging member engages the engageable portion of the second switch valve, so that the supplying of negative pressure to one suction nozzle is stopped, the one suction nozzle releases an EC, and the EC is mounted on the PWB. In each case, in a terminal portion or period of the movement of the engaging member, the first or second switch valve is switched, so that the negative pressure is supplied to one suction nozzle immediately before the one suction nozzle contacts the EC, or the supplying of negative pressure to one suction nozzle is stopped immediately before the EC held by the one suction nozzle contacts the PWB. Thus, one suction nozzle can hold and release an EC at respective appropriate timings, not too early or not too late, so that the EC is reliably taken from the EC supplying device and mounted on the PWB supported by the board supporting device. In addition, since the supplying of negative pressure to one suction nozzle is stopped while the one suction does not hold an EC, the negative pressure does not leak from the one suction nozzle, so that a sufficient amount of negative pressure can be supplied to the other suction nozzle or nozzles which is or are holding an EC or respective ECs.

(12) According to a twelfth feature of the present invention that includes the eleventh feature (11), the each switch valve device is switched, when the second switch valve thereof is switched to the state to stop the supplying of the negative pressure to the one suction nozzle, to a state in which the each switch valve device permits supplying of a positive pressure to the one suction nozzle. When the positive pressure is supplied to one suction nozzle, the one suction nozzle positively releases an EC. Therefore, when the one suction nozzle is moved away from the PWB, the EC does not stick to the one nozzle, so that the EC is reliably mounted on the PWB.

(13) According to a thirteenth feature of the present invention that includes any one of the tenth to twelfth features (10) to (12), the switch valves of the each switch valve device comprises a first switch valve and a second switch valve each of which comprises a spool valve including a spool, and wherein the respective spools of the respective first switch valves of the switch valve devices are provided along a second circle whose center is located on the axis line of the rotatable body and whose diameter is smaller than a diameter of the first circle along which the suction nozzles are provided, and the respective spools of the respective second switch valves of the switch valve devices are provided along a third circle whose center is located on the axis line of the rotatable body and whose diameter is smaller than the diameter of the first circle and is different from the diameter of the second circle, such that the respective spools of the respective second switch valves are alternate with the respective spools of the respective first switch valves in a zigzag pattern in a circumferential direction of the rotatable body. The improvement of EC mounting efficiency may be achieved by decreasing the outer diameter of the rotatable body. The smallest diameter of the first circle along which the suction nozzles are provided, depends on the size (i.e., the greatest diameter) of each suction nozzle and the total number of the suction nozzles. Thus, for decreasing the outer diameter of the rotatable body, it is desirable that the first and second switch valves be provided radially inward of the suction nozzles. That is, it is desirable to minimize the respective diameters of the second and third circles along which the first and second switch valves are provided. To this end, in the present EC mounting system, the respective first spools of the first switch valves are alternate with the respective second spools of the second switch valves in a zigzag or stagger pattern or fashion in a circumferential direction of the rotatable body. The respective diameters of the second and third circles can be decreased for the following reasons: First, the difference between the respective diameters of the second and third circles can be decreased as compared with the case where each pair of first and second spools are aligned with each other in a radial direction of the rotatable body, and accordingly the diameter of the greater or outer one of the second and third circles can be decreased. Second, the diameter of the greater one of the second and third circles can be decreased as compared with the case where the first spools and the second spools are provided along a single or common circle whose diameter must be great. For these reasons, the outer diameter of the rotatable body can be decreased by providing the first spools and the second spools along the second and third circles, respectively, in a zigzag fashion. Consequently the rotatable body can he rotated at higher speeds, and the noise and vibration generated from the body can be reduced. In addition, since only a smaller centrifugal force is exerted to the EC held by each suction nozzle, the EC mounting efficiency can be improved. Moreover, the mass of the rotatable body can be easily decreased, and accordingly the movable member can be moved at higher speeds, which leads to improving the EC mounting efficiency. The thirteenth feature (13) is advantageously combined with the twentieth feature (20) wherein the image taking device simultaneously takes respective images of the ECs sucked and held by the suction nozzles, because the image taking device can be more simply constructed and disposed since all the ECs held by the suction nozzles are contained in a smaller area.

(14) According to a fourteenth feature of the present invention that includes any one of the ninth to thirteenth features (9) to (13), the at least one switch valve of each of the switch valve devices comprises a spool valve comprising a spool which extends in a direction having an angle relative to a horizontal plane, and which is movable to an upper position thereof and a lower position thereof to control supplying of a negative pressure to one of the suction nozzles that corresponds to the each switch valve device; and a spool-downward-movement preventing device which prevents, at at least the upper position of the spool, a downward movement of the spool because of gravity, and permits a downward movement of the spool by engagement of the spool with the valve-engaging portion of the engaging member. The spool is moved downward by engagement thereof with the valve-engaging portion of the engaging member, so that the switch valve is switched from a state in which the switch valve stops the supplying of negative pressure, to another state in which the switch valve allows the supplying of negative pressure. Since the spool-downward-movement preventing device prevents, at the upper position of the spool, a downward movement of the spool because of gravity, the switch valve is not switched by the weight of the spool, but is switched by only the downward movement of the spool caused by the engagement of the spool with the engaging member. At the lower position of the spool, the spool may be supported by a support member which is employed for preventing the spool from moving further downward from its lower position. Alternatively, the spool-downward-movement preventing device may be adapted to prevent, also at the lower position of the spool, a further downward movement of the spool because of gravity. The fourteenth feature (14) may be employed independent of any of the fourth to ninth features (4) to (9), i.e., may be generally or widely employed in a switch valve which is switchable by engagement thereof with an engaging member and which controls the supplying of negative and/or positive pressure to a suction nozzle.

(15) According to a fifteenth feature of the present invention that includes the fourteenth feature (14), the rotatable body has a plurality of spool holes in which the respective spools of the respective spool valves of the switch valve devices are fitted, respectively, and wherein the spool-downward-movement preventing device of the each switch valve device comprises a pressure-based spool-downward-movement preventing device which applies at least one of a positive pressure and a negative pressure, to a local portion of an outer circumferential surface of a corresponding one of the spools in a circumferential direction of the one spool, and thereby presses the one spool against an inner circumferential surface of a corresponding one of the spool holes, so that the one spool is prevented from moving downward, by a frictional force which is produced between the outer circumferential surface of the one spool and the inner circumferential surface of the one spool hole. The pressure-based spool-downward-movement preventing device may be a simple one wherein an air passage which can be closed by one spool crosses a corresponding spool hole, a first portion of the air passage on one side of the spool is connected to a positive- or negative-pressure source, and a second portion of the air passage on the other side of the spool is connected to the atmosphere, or alternatively the first portion of the air passage is connected to a positive-pressure source and the second portion is connected to a negative-pressure source. In either case, in a state in which the spool closes the air passage, different pressures act on diametrically opposite portions of the spool, respectively, so that the pressure difference presses the spool against the inner surface of the spool hole. Otherwise, an air passage may be only partly interfered with by the spool or the spool hole, so that a positive or negative pressure is always present throughout the air passage, i.e., on both sides of the spool. In this case, if a clearance between the spool and the inner surface of the spool hole is communicated with the atmosphere, the positive or negative pressure is only locally applied to a certain portion of the outer surface of the spool in a circumferential direction of the spool, so that the locally applied pressure presses the spool against the inner surface of the spool hole. In the case where the positive pressure acts on the spool, the clearance between the spool and the spool hole may be communicated with a negative-pressure source.

(16) According to a sixteenth feature of the present invention that includes any one of the tenth to fifteenth features (9) to (15), the switch valves of the each switch valve device comprises a first switch valve and a second switch valve each of which comprises a spool valve including a spool, and wherein the rotatable body has a negative-pressure passage through which a negative pressure is supplied to one of the suction nozzles that corresponds to the each switch valve device and which communicates with the first and second switch valves in series, and a positive-pressure passage through which a positive pressure is supplied to the one suction nozzle and which communicates with the second switch valve, and wherein in a state in which the first and second switch valves are positioned at respective upper positions thereof, the negative-pressure passage is closed by the first switch valve and is opened by the second switch valve, and the positive-pressure passage is closed by the second switch valve, and, when the spool of the first switch valve is moved to a lower position thereof from the state, the negative-pressure passage is completely opened, and when the spool of the second switch valve is additionally moved to a lower position thereof, the negative-pressure passage is closed and the positive-pressure passage is opened. In the state in which the first and second switch valves are positioned at their upper positions, one suction nozzle is not supplied with the negative pressure passage or the positive pressure, and cannot suck or hold an EC. When the first spool of the first switch valve is moved to its lower position, the one suction nozzle is supplied with the negative pressure, and sucks and holds an EC. In this state, when the second spool of the second switch valve is moved to its lower position, the one suction nozzle is disconnected from the negative pressure and is supplied with the positive pressure, so that the one suction nozzle positively releases the EC. Since the positive-pressure passage is opened and closed by the second spool of the second switch valve, it is not essentially required that the positive-pressure passage is communicated with the first switch valve. However, the positive-pressure passage may be communicated with the first switch valve, because the shape of the first spool and/or the position of the positive-pressure passage can be so determined that the positive-pressure passage cannot completely be closed by the first spool. For example, in the case where an axis line of the positive-pressure passage perpendicularly intersects an axis line of the first spool, the first spool may include a small-diameter portion which is located in the positive-pressure passage, so that the first spool cannot completely close the positive-pressure passage. Alternatively, the positive-pressure passage may be partly interfered with by the first spool, according to the seventeenth feature (17) described below. In the latter case, the fourteenth feature (14) can be easily employed. The sixteenth feature (16) may be employed independent of any of the fourth to ninth features (4) to (9), i.e., may be generally or widely employed in a switch valve which is switchable by engagement thereof with an engaging member and which controls the supplying of negative and/or positive pressure to a suction nozzle.

(17) According to a seventeenth feature of the present invention that includes the sixteenth feature (16), the positive-pressure passage communicates with the spool hole of the first switch valve, such that the positive-pressure passage is partly interfered with by the spool of the first switch valve, and a clearance between an outer circumferential surface of the spool of the first switch valve and an inner circumferential surface of the spool hole of the first switch valve communicates with a space whose pressure is lower than the positive pressure supplied through the positive-pressure passage, and wherein the positive-pressure passage communicates with the spool hole of the second switch valve, and a clearance between an outer circumferential surface of the spool of the second switch valve and an inner circumferential surface of the spool hole of the second switch valve communicates with a space whose pressure is lower than the positive pressure supplied through the positive-pressure passage. The space whose pressure is lower than the positive pressure may be the atmosphere or the negative-pressure passage. In the present EC mounting system, the first spool of the first switch valve, being positioned at each of its upper and lower positions, does not completely close the positive-pressure passage, and is pressed against the inner surface of the first spool hole by the positive pressure supplied through the positive-pressure passage, so that the first spool is prevented from moving downward. The second spool of the second switch valve, being positioned at its upper position, closes the positive-pressure passage, and is pressed against the inner surface of the second spool hole by the positive pressure, so that the second spool is prevented from moving downward.

(18) According to an eighteenth feature of the present invention that includes the fourteenth feature (14), the spool-downward-movement preventing device comprises a friction ring which is supported by the rotatable body such that the friction ring is not movable relative to the rotatable body and is interference-fitted on the spool, and which prevents the downward movement of the spool, owing to a frictional force which is produced between the spool and the friction ring. The friction ring can prevent the downward movement of the spool, at an arbitrary position in a direction parallel to the axis line of the rotatable body.

(19) According to a nineteenth feature of the present invention that includes any one of the eleventh to eighteenth features (11) to (18), the first and second switch valves include, in addition to respective first engageable portions as the respective engageable portions thereof which are engageable with the valve-engaging portion of the engaging member, respective second engageable portions, and wherein the system further comprises a returning device which is simultaneously engageable with the second engageable portions of the first and second switch valves, to simultaneously return the first and second switch valves to respective initial states thereof in which the first and second switches cooperate with each other to stop the supplying of the negative pressure, and the supplying of the positive pressure, to the one suction nozzle. The returning device simultaneously engages the respective engageable portions of the first and second switch valves, and simultaneously returns the first and second switch valves to their initial states. In the present EC mounting system, the first and second switch valves can be easily and quickly returned to their initial states. The returning device may be, as will be described in DETAILED DESCRIPTION OF THE PREFERRED EMBODIMENTS, one which simultaneously returns all the switch valves of the plurality of switch valve devices of the EC mounting system.

(20) According to a twentieth feature of the present invention, there is provided an electric-component mounting system, comprising a board supporting device which supports a printed-wiring board; a movable member which is movable to an arbitrary position on a movement plane parallel to the printed-wiring board supported by the board supporting device; a main moving device which moves the movable member; a rotatable body which is attached to the movable member such that the rotatable body is rotatable about an axis line thereof perpendicular to the movement plane; a rotatable-body rotating device which rotates the rotatable body about the axis line thereof; a plurality of suction nozzles which sucks and holds respective electric components and which are supported by the rotatable body at respective positions offset from the axis line of the rotatable body; a nozzle moving device which moves at least one of (a) each of the suction nozzles and (b) the board supporting device, toward, and away from, the other of the each suction nozzle and the board supporting device, in a direction perpendicular to the movement plane; an image taking device which simultaneously takes, during a movement of the rotatable body caused by the movement of the movable member by the main moving device, respective images of the electric components held by the suction nozzles, while the image taking device is moved with the rotatable body; and a control device which obtains information by processing the images of the electric components taken by the image taking device, and controls, based on the obtained information, at least one of the main moving device, the rotatable-body rotating device, and the nozzle moving device. The image taking device may be a surface-image taking device which has an image-take surface capable of simultaneously forming respective images of all the ECs. The rotatable body may be rotated to move sequentially the suction nozzles to an EC-suck position, change the current rotation position of the EC held by one suction nozzle, correct a rotation-position error of the EC held by one suction nozzle, and/or shorten a distance of movement of the movable member. Based on the taken image of the EC held by one suction nozzle, the control device may determine at least one position error of the EC held by the one suction nozzle, so that the EC can be mounted with an accurate rotation position, at an accurate EC-mount location on the PWB. The present EC mounting system can enjoy the same advantages as those described in connection with the second and third features (2) and (3).

(21) According to a twenty-first feature of the present invention that includes the twentieth feature (20), the main moving device comprises a slide which is movable in an X-axis direction parallel to the movement plane, and moves, on the slide, the movable member in a Y-axis direction parallel to the movement plane and perpendicular to the X-axis direction, wherein the image taking device is attached with the rotatable body to the movable member, and wherein the system further comprises a reflecting device which is supported by the slide such that the reflecting device is opposed to a path of movement of the rotatable body and the image taking device, and which causes the respective images of the electric components held by the suction nozzles, to be incident to the image taking device. The reflecting device may be provided by a prism which has, as will be described in DETAILED DESCRIPTION OF THE PREFERRED EMBODIMENTS, two reflecting surfaces which are inclined by about 45 degrees, symmetrically with each other, with respect to a plane containing the axis line of the rotatable body; or a mirror which extends perpendicularly to the axis line of the rotatable body. Since the image taking device is attached together with the rotatable body to the movable member, the respective relative positions of the image taking device and the ECs held by tale suction nozzles do not change, so that while the image taking device is moved by the movement of the movable member, it can take respective images of the ECs as if they were still. When the movable member is moved in the Y-axis direction, the ECs pass by the reflecting device provided on the slide. Thus, the ECs can be moved directly to respective target positions, without taking any detours, while respective images thereof are taken by the image taking device. For example, in the case where the board supporting device and an EC supplying device are provided on both sides of the reflecting device in the Y-axis direction, the suction nozzles must pass by the reflecting device, when they are moved to the PWB after they suck and hold respective ECs. Thus, the image taking device can take respective images of the ECs, while the suction nozzles are moved from the EC supplying device to the board supporting device over the shortest distance therebetween. In addition, since the image taking device is moved with the rotatable body, the present EC mounting system does not need an exclusive moving device for moving the image taking device, which leads to simplifying the construction of the system.

(22) According to a twenty-second feature of the present invention that includes the twentieth or twenty-first feature (20) or (21), the control device comprises an error-elimination control portion which determines, based on the information obtained by processing the images of the electric components taken by the image taking device, at least one position error of the electric component held by each of the suction nozzles, and controls at least one of the main moving device and the rotatable-body rotating device to eliminate the determined position error, and thereby eliminate at least one position error of the electric component relative the printed-wiring board on which the electric component is to be mounted.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described, by reference to the drawings, an electric-component ("EC") mounting machine to which the present invention is applied and which carries out an EC mounting method to which the present invention is also applied.

Figure 1:
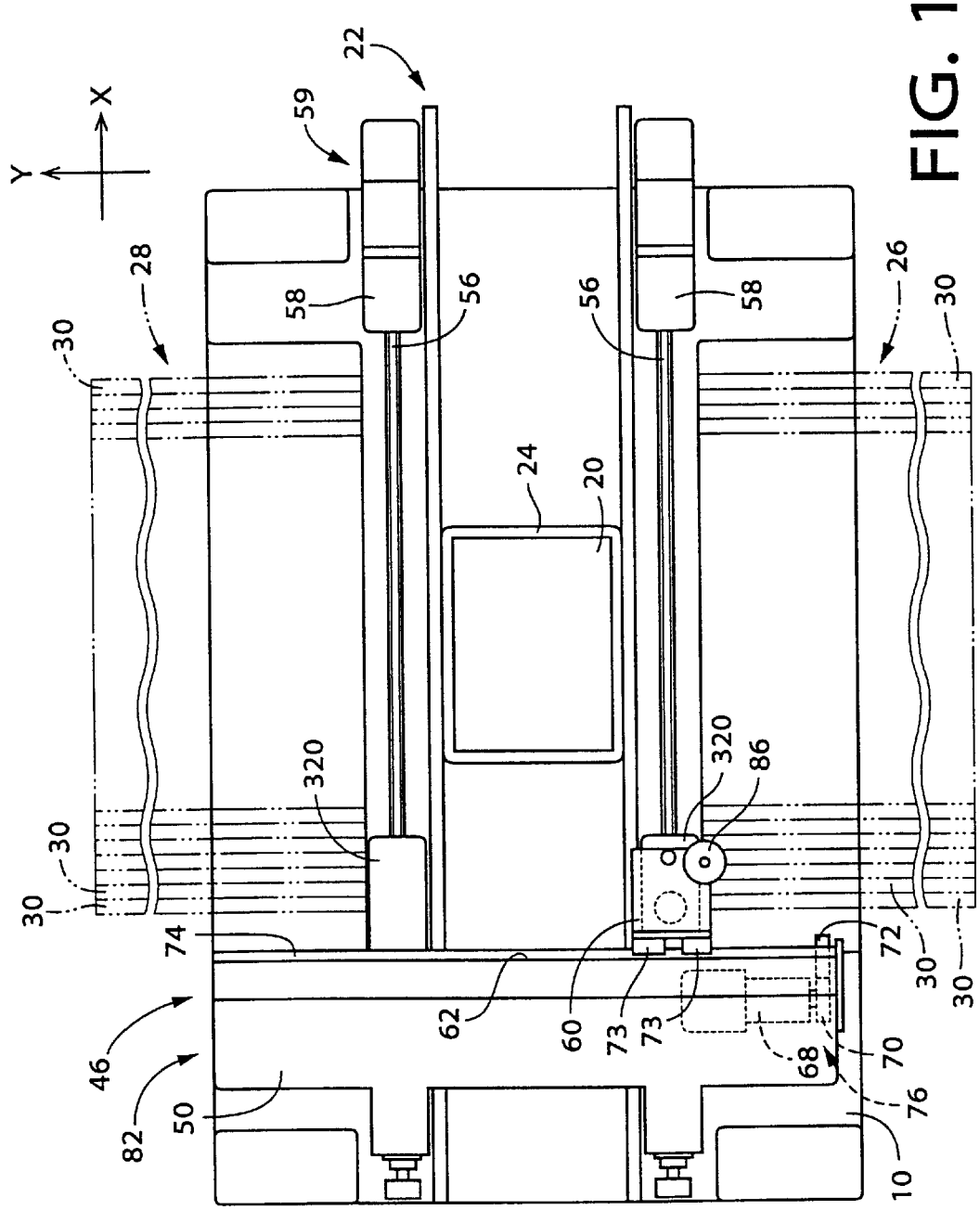
FIG. 1 is a plan view of an electric-component ("EC") mounting machine including an EC mounting system to which the present invention is applied.
Figure 2:
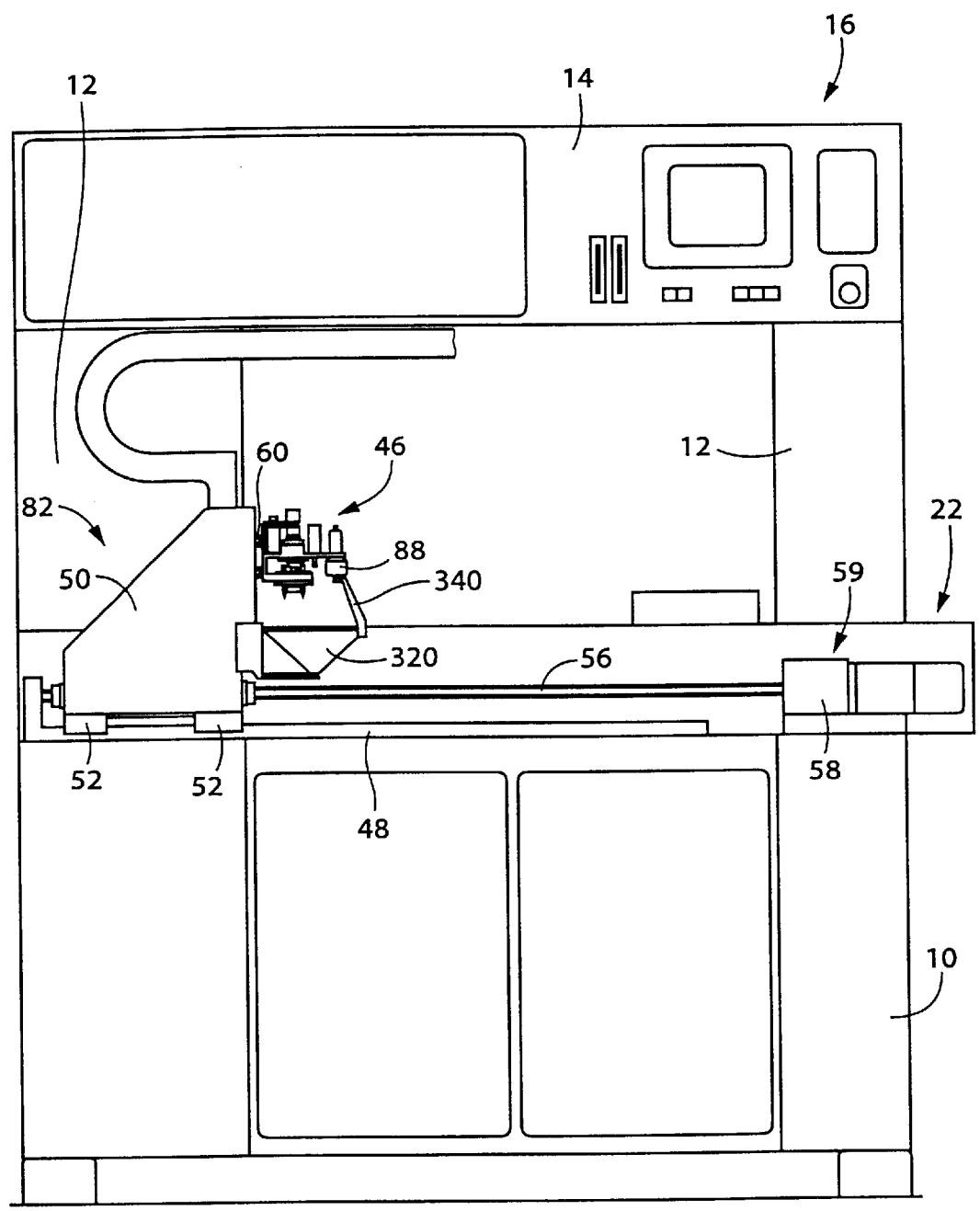
FIG. 2 is a front elevation view of the EC mounting machine of FIG. 1.

In FIG. 2, reference numeral 10 designates a base. On the base 10, a plurality of columns 12 stand, and a stationary table 14 on which an operation panel 16 and other elements are provided is fixed to the columns 12. On the base 10, there is also provided, as shown in FIG. 1, a board conveyor 22 as a board transferring device which transfers a printed-wiring board ("PWB") 20 in an X-axis direction (i.e., a left-right direction in FIGS. 1 and 2). The PWB 20 is transferred or conveyed by the board conveyor 22, and is positioned and supported, by a board supporting device 24, at a predetermined position and in a state in that the PWB 20 takes a horizontal posture.

Two feeder-type EC supplying devices 26, 28 each as a sort of EC supplying device are provided on two portions of the base 10 that are opposite to each other in a Y-axis direction perpendicular to the X-axis direction on a horizontal plane. Each of the EC supplying devices 26, 28 includes a number of EC-supply feeders 30 which are disposed in a state in which respective EC-supply portions of the feeders 30 are arranged along a reference line. In the present embodiment, the reference line is a straight line parallel to the X-axis direction. Each of the feeders 30 holds an EC carrier tape. The EC carrier tape includes an EC-accommodating tape having EC-accommodating portions or pockets which are formed at a regular interval of distance in a lengthwise direction thereof and each of which accommodates an EC; and a cover tape which is adhered to the EC-accommodating tape to cover respective tipper openings of the EC-accommodating pockets thereof, thereby preventing the ECs from jumping out of the pockets when the EC carrier tape is fed. Each feeder 30 includes an EC-carrier-tape feeding device and a cover-tape taking-up device, and a drive source of those two devices. While the EC-carrier-tape feeding device feeds the EC carrier tape at a predetermined feeding pitch in the Y-axis direction, and the cover-tape taking-up device peels the cover tape off the EC-accommodating tape and takes up the cover tape onto a take-up member thereof, each of the ECs is fed to an EC-supply position in the EC-supply portion of the each feeder 30. However, since the construction of each feeder 30 is not essentially relevant to the present invention, no detailed description thereof is provided.

ECs 44 (FIG. 5) which are supplied by the EC supplying devices 26, 28 are mounted on the PWB 20, by an EC mounting system 46 provided on the base 10, so as to produce a printed circuit board. Thus, the present EC mounting machine includes the EC supplying devices 26, 28, the EC mounting system 46, the board conveyor 22, and the board supporting device 24.

Figure 3:
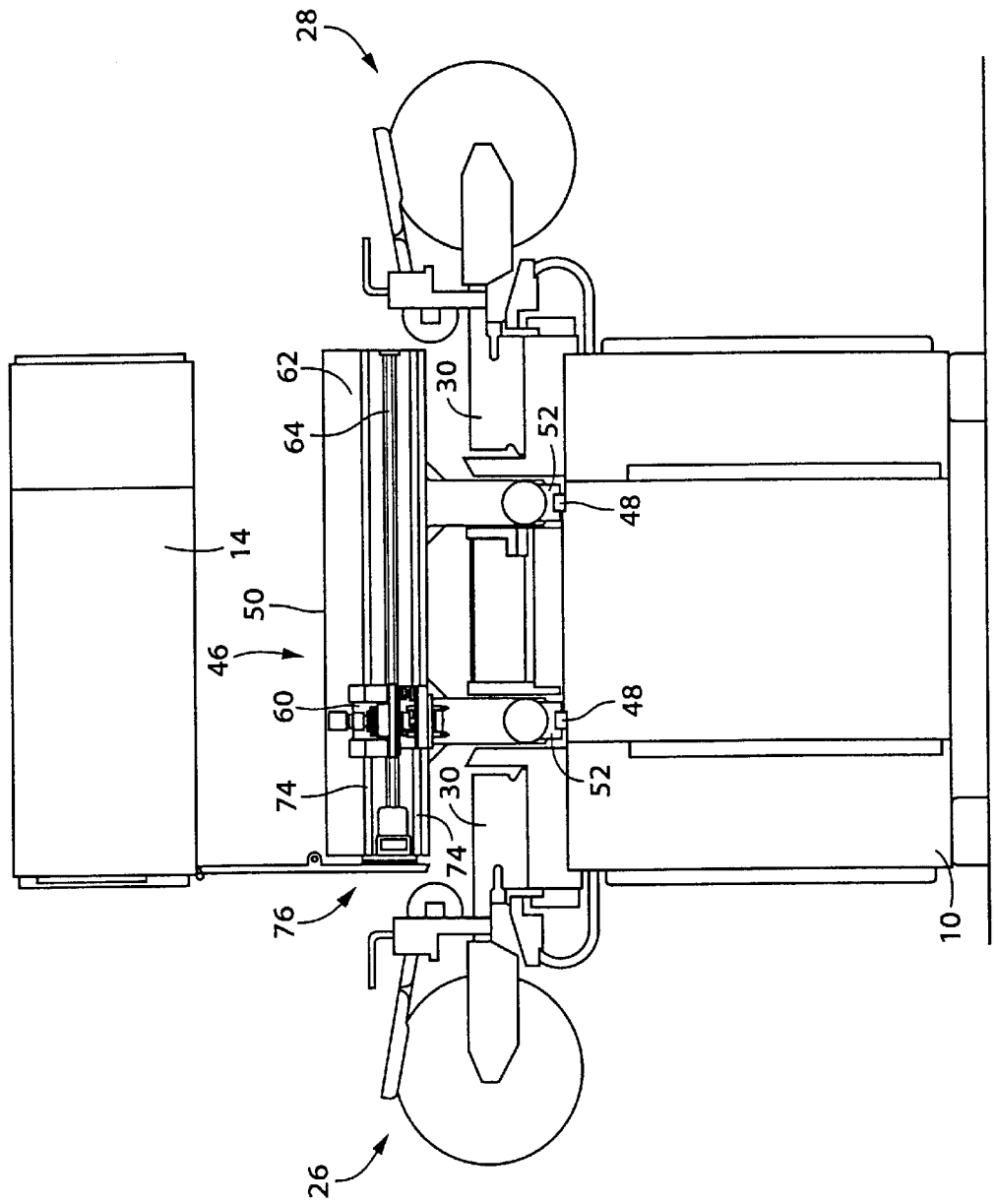
FIG. 3 is a side elevation view of the EC mounting machine of FIG. 1.
Figure 4:
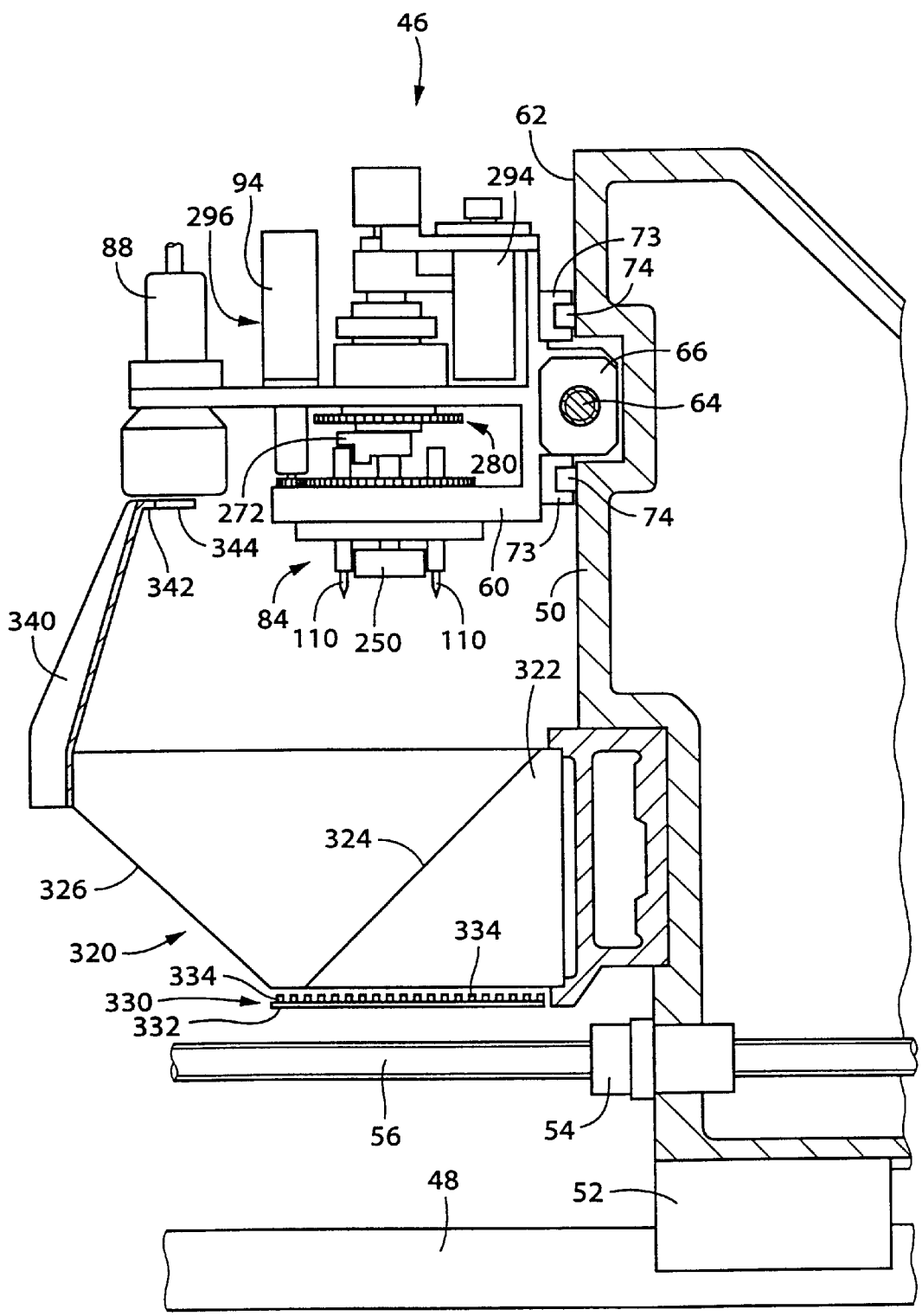
FIG. 4 is a partly cross-sectioned, rear elevation view of the EC mounting machine.

As shown in FIG. 3, two guide rails 48 which extend parallel to each other in the X-axis direction are provided, on the base 10, on both sides of the board conveyor 22 in the Y-axis direction. An X-axis slide 50 fits on the two guide rails 48 via respective guide blocks 52. As shown in FIG. 1, the X-axis slide 50 has a length over the two EC supplying devices 26, 28 and the hoard conveyor 22, and two nuts 54 (only one nut 54 is shown in FIG. 4) are fixed to the X-axis slide 50. The two nuts 54 are threadedly engaged with two ball screws 56, respectively. When the two ball screws 56 are rotated in synchronism with each other by two X-axis servomotors 58, respectively, the X-axis slide 50 is moved in the X-axis direction. Thus, the nuts 54, the ball screws 56, and the X-axis servomotors 58 cooperate with one another to provide an X-axis-slide moving device 59; and the guide rails 48 and the guide blocks 52 cooperate with each other to provide a guiding device which guides the movement of the X-axis slide 50.

On the X-axis slide 50, a Y-axis slide 60 is provided such that the Y-axis slide 60 is movable in the Y-axis direction perpendicular to the X-axis direction on the horizontal plane and is parallel to the horizontal plane. As shown in FIG. 3, the X-axis slide 50 has a vertical surface 62 to which a ball screw 64 which extends in the Y-axis direction is fixed, and a nut. 66 (FIG. 4) fixed to the Y-axis slide 60 is threadedly engaged with the ball screw 64. When the ball screw 64 is-rotated by a Y-axis servomotor 68, shown in FIG. 1, via gears 70, 72, Ache Y-axis slide 60 is moved in the Y-axis direction by being guided by a pair of guide blocks 73 and a pair of guide rails 74. The ball screw 64, the nut 66, the Y-axis servomotor 68, and others cooperate with one another to provide a Y-axis-slide moving device 76; and the guide blocks 73 and the guide rails 74 cooperate with each other to provide a guiding device which guides the movement of the Y-axis slide 60.

The Y-axis slide 60 is composed of a plurality of members, for easier production purposes, and those members assembled with each other function as the integral Y-axis slide 60. In the present embodiment, the Y-axis slide 60 functions as a movable member; the X-axis slide 50, the X-axis-slide moving device 59 and the Y-axis-slide moving device 76, and the two guiding devices for guiding the respective movements of the X-axis and Y-axis slides 50, 60 cooperate with one another to provide a main moving device 82. In the present embodiment, a horizontal plane is a movement plane parallel to the PWB 20, and the Y-axis slide 60 is moved on the X-axis slide 50, by the main moving device 82, in the Y-axis direction parallel to the horizontal plane and perpendicular to the X-axis direction, and is moved, relative to the PWB 20 horizontally supported by the board supporting device 24, to an arbitrary position on the horizontal plane.

The Y-axis slide 60 supports an EC mounting head 84 (FIG. 4), a CCD (charge-coupled device) camera 86 (FIG. 1) which takes images of reference marks affixed to the PWB 20, and a CCD camera 88 as an image taking device which takes images of ECs 44. As shown in FIG. 2, the CCD camera 88 is fixed to a projecting end portion of the Y-axis slide 60 that projects in the X-axis direction, such that the CCD camera 88 is aligned with the EC mounting head 84 in the Y-axis direction and is oriented downward.

Figure 5:
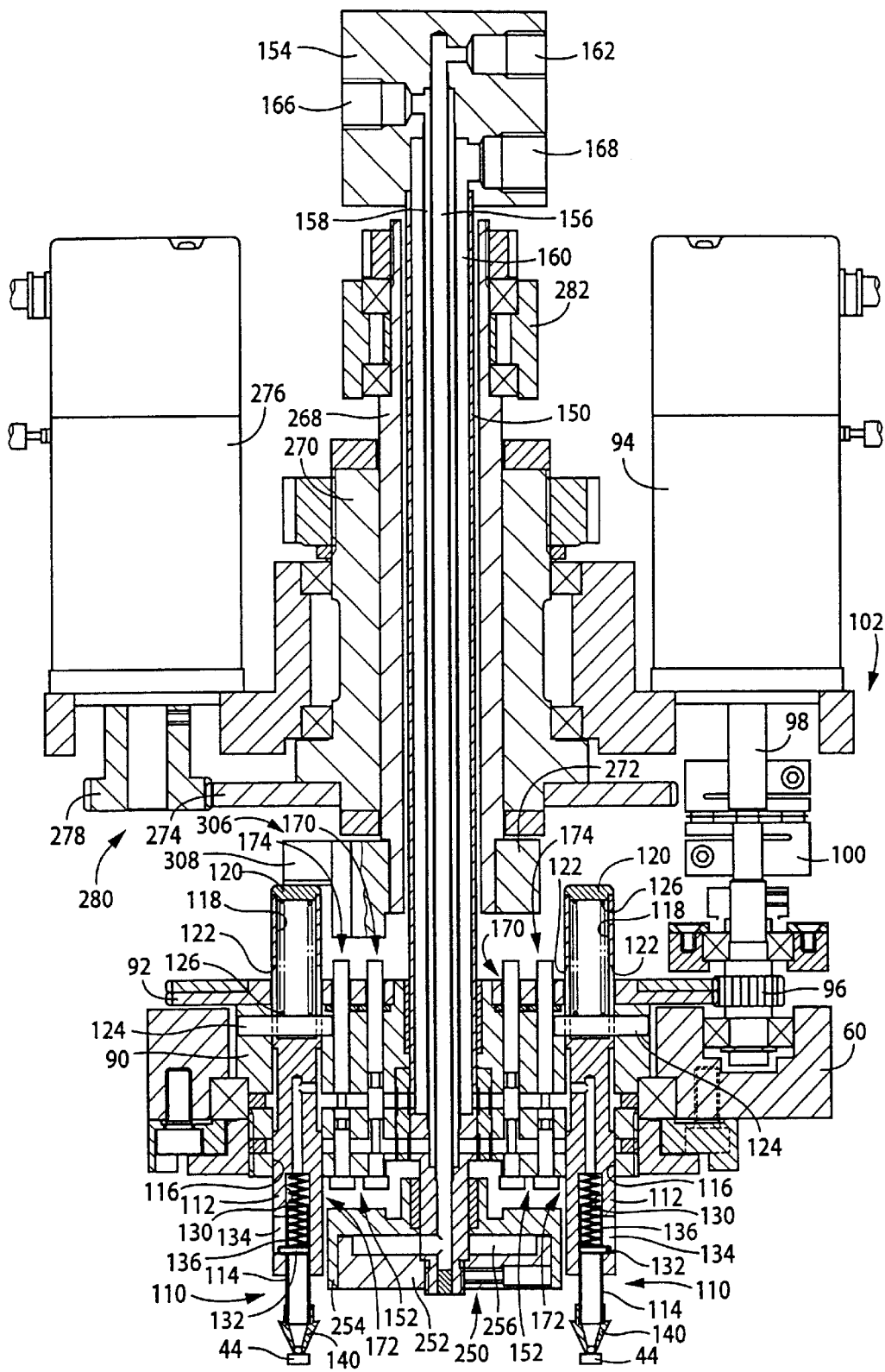
FIG. 5 is a partly cross-sectioned, front elevation view of suction nozzles, a rotatable body, and a butting-member rotating device of the EC mounting machine.
Figure 6:
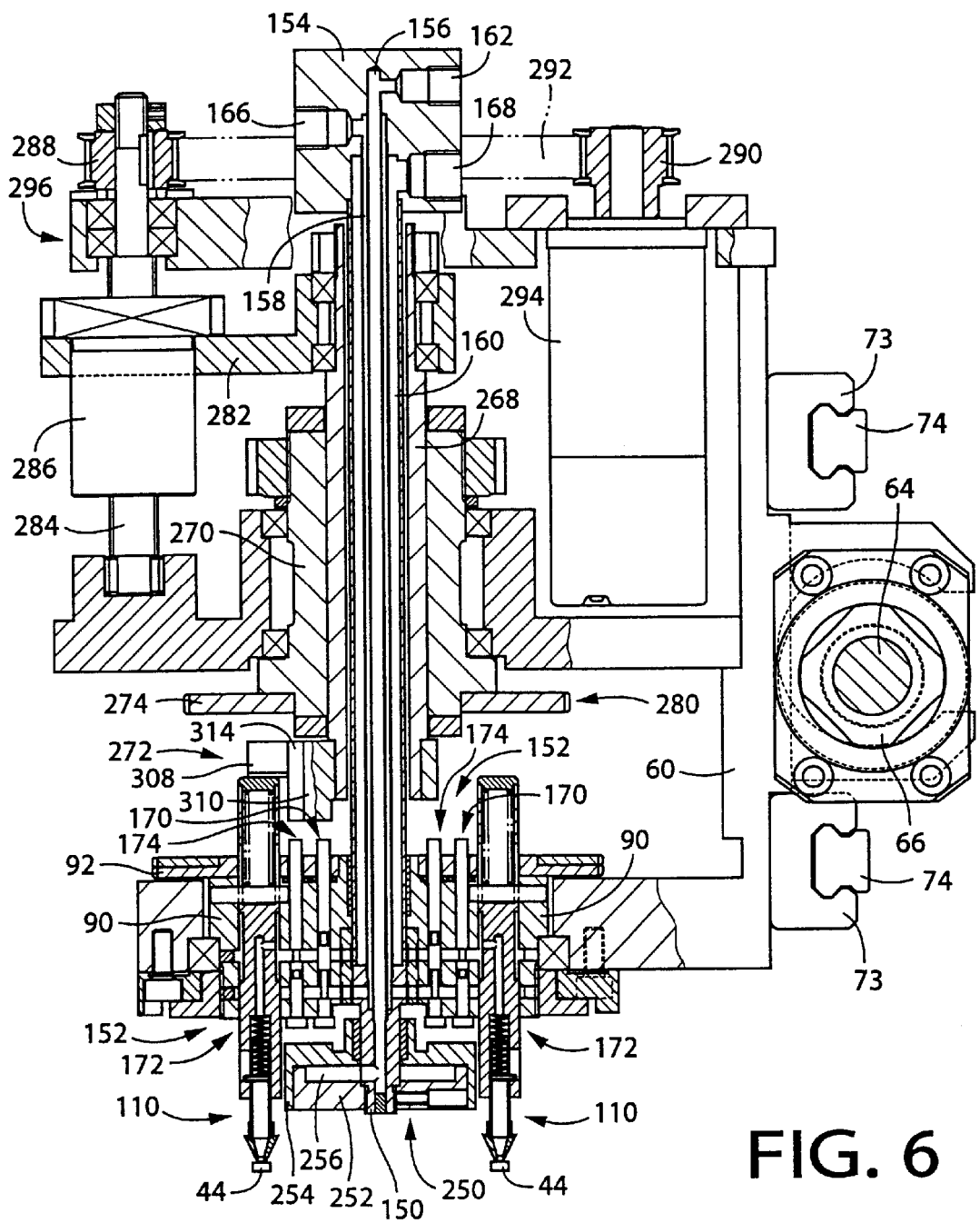
FIG. 6 is a partly cross-sectioned, front elevation view of the suction nozzles, the rotatable body, and a butting-member moving device of the EC mounting machine.

As shown in FIGS. 5 and 6, the EC mounting head 84 includes a rotatable body 90. The rotatable body 90 is supported by the Y-axis slide 60, such that the rotatable body 90 is rotatable about a vertical axis line as a rotation-axis line perpendicular to the horizontal, movement plane. That is, the rotatable body 90 is rotatable about an axis line perpendicular to the PWB 20 which is horizontally supported. When the Y-axis slide 60 is moved by the main moving device 82, the rotatable body 90 is moved to an arbitrary position on the horizontal plane. Thus, the EC mounting system 46 can be said as a rotatable-body-moving-type EC mounting system.

The rotatable body 90 has a circular cross section, and a driven wheel 92 is concentrically fixed to an upper end as one of axially opposite ends of the rotatable body 90 and is meshed with a drive wheel 96 which is rotated by a rotatable-body rotating motor 94. As shown in FIG. 4, the rotating motor 94 is supported by the Y-axis slide 60, such that the motor 94 is oriented downward. The drive wheel 96 is connected to an output shaft 98 of the rotating motor 94 via a coupling 100. The rotation of the rotating motor 94 is transmitted to the rotatable body 90 via the drive and driven wheels 96, 92, so that the rotatable body 90 is rotated about a vertical axis line thereof by an arbitrary angle in each of opposite directions. In the present embodiment, the driven wheel 92, the drive wheel 96, and the rotatable-body rotating motor 94 cooperate with one another to provide a rotatable-body rotating device 102 which rotates the rotatable body 90. While in the present embodiment the driven wheel 92 is provided separately from the rotatable body 90 and is fixed to the same 90, the rotatable body 90 may include a driven portion as an integral portion thereof.

The rotatable body 90 supports a plurality of (in the present embodiment, sixteen) suction nozzles 110 at a plurality of (sixteen) positions away from the rotation-axis line of the rotatable body 90 (in the present embodiment, a plurality of positions on a circle whose center is located on the axis line of the rotatable body 90), respectively, such that each of the suction nozzles 11(0 is movable relative to the body 90 in an axial direction of the body 90, i.e., a direction parallel to the axis line of the body 90, but is not rotatable relative to the body 90. When the rotatable body 90 is rotated, each of the suction nozzles 110 is revolved about the axis line of the body 90, so as to be moved to an arbitrary rotation position about the axis line of the body 90. Each of the suction nozzles 110 which are supported by the rotatable body 90 such that the nozzles 110 are not rotatable relative to the body 90, takes, at different rotation positions about the axis line of the body 90, different rotation phases about an axis line of the each suction nozzle 100, respectively. The sixteen suction nozzles 110 are supported by the rotatable body 90 such that the suction nozzles 110 are angularly (in the present embodiment, equiangularly) spaced from one another. In the present embodiment, the sixteen suction nozzles 110 are of a same sort, and accordingly one of them will be described below as a representative thereof. However, at least two suction nozzles of the plurality of suction nozzles 110 may be of different sorts which are for holding, by suction, different sorts of ECs 44 having, e.g., different shapes and/or dimensions.

Figure 8:
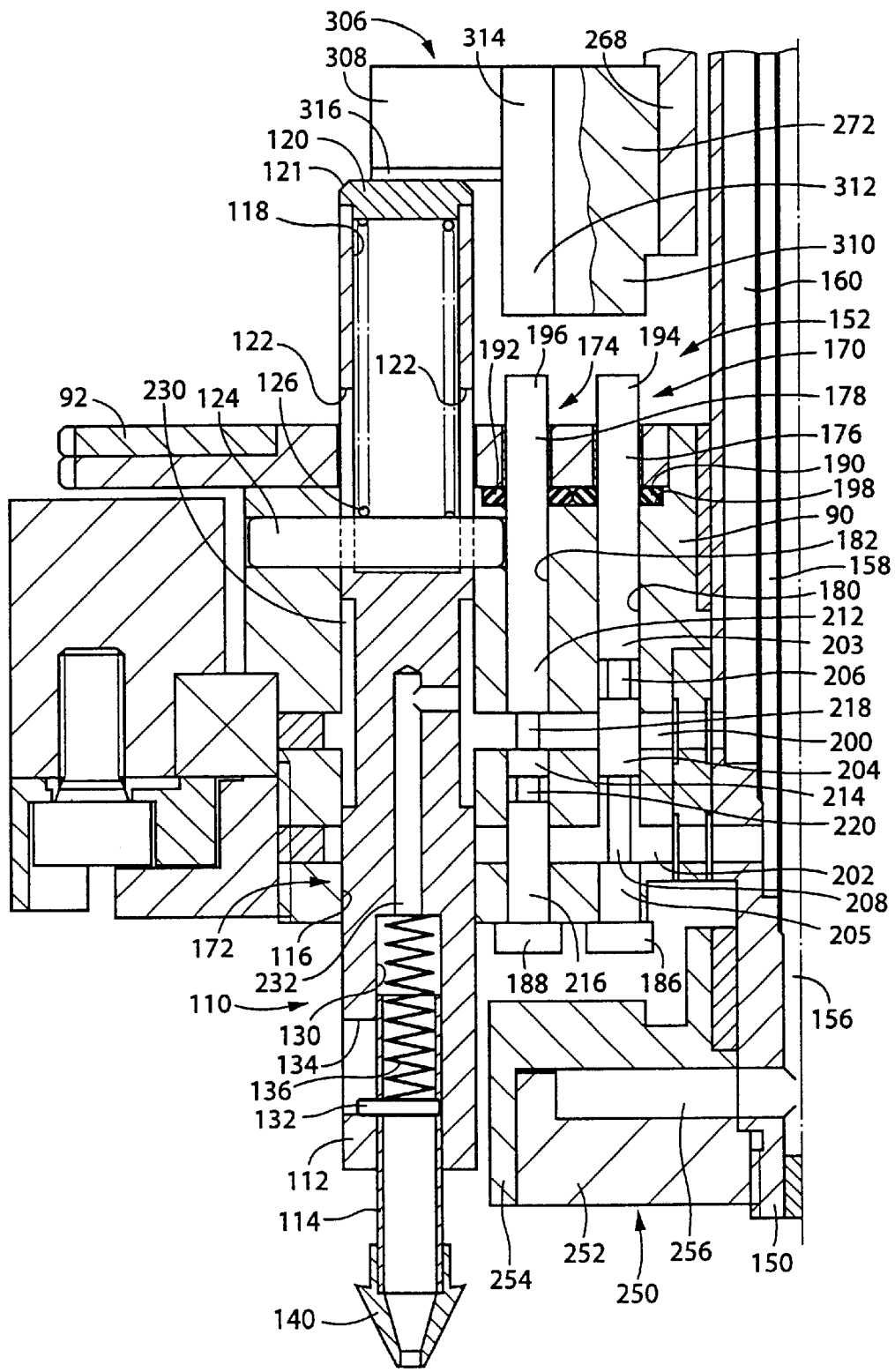
FIG. 8 is a cross-sectioned, front elevation view of the suction nozzle and a switch valve device of the EC mounting machine.

As shown in FIGS. 5 and 8, the suction nozzle 110 includes a first member 112, and a second member 114 held by the first member 112. The rotatable body 90 has a plurality of (in the present embodiment, sixteen) holding holes 116 which are formed through the body 90 in a direction parallel to the axis line of the body 90 and which are equiangularly spaced from one another along a circle whose center is located on the axis line of the body 90. The first member 112 of the suction nozzle 110 is fitted in the holding hole 116, such that the first member 1.12 is movable or slideable in the holding hole 116 in an axial direction of the suction nozzle 110. The first member 112 has a circular cross section, and has a hole 118 which has a bottom and which opens in an upper surface of the first member 112 and is closed by a cap 120. An upper end portion of the cap 120 is chamfered to provide a guide surface 112. A wall of the first member 112 that defines the hole 118 has a pair of elongate holes 122 at two locations which are diametrically opposed to each other. A pin 124 which is fitted in the rotatable body 90 is fitted in the two elongate holes 122. The pin 124 is fitted in the rotatable body 90 such that the pin 124 extends in a direction perpendicular to the axis line of the body 90. The engagement of the pin 124 with the elongate holes 122 prevents the first member 112 (or the suction nozzle 110) from being rotated relative to the rotatable body 90.

A compression coil spring 126 as a sort of spring member as an elastic member as a sort of biasing device is provided in the hole 118. The spring 126 biases the first member 112 in an upward direction. Thus, in a state in which the first member 112 is opposed to the PWB 20 or the feeder 30, the spring 126 biases the first member 112 in a direction away from the PWB 20 or the feeder 30. A limit of movement of the first member 112 by the biasing action of the spring 126 is defined by engagement of respective one ends of the elongate holes 122 with the pin 124. A position where the suction nozzle 110 is moved upward by the biasing action of the spring 126 and the respective one ends of the elongate holes 122 of the first member 112 butt on the pin 124, is an upper-dead position as a movement-end position of the suction nozzle 110 in the direction away from the PWB 20 or the feeder 30. Thus, the pin 124 as an engaging portion which is provided on the rotatable body 90, and the elongate holes 122 as engaging portions which are provided on the first member 122 cooperate with each other to provide a relative-rotation preventing device which prevents the first member 112 from being rotated relative to the rotatable body 90, while permitting the first member 112 to be moved relative to the body 90 in the axial direction thereof, and provide a movement-limit defining device which defines the limit of movement of the first member 112 by the biasing action of the spring 126, or an upper-dead-position defining device which defines the upper-dead position of the suction nozzle 110.

The second member 114 has a cylindrical shape, and is axially slideably fitted in a fitting hole 130 which has a bottom and which is formed in the first member 112 such that the fitting hole 130 opens downward. A pin 132 as an engaging portion is fitted in the second member 114, such that the pin 132 extends in a direction perpendicular to an axial direction of the second member 114. The pin 132 is also fitted in an elongate hole 134 as an engaging portion of the first member 112, so that the second member 114 is permitted to be moved relative to the first member 112 in the axial direction of the suction nozzle 110 and is prevented from being rotated relative to the same 112.

The second member 114 is biased in a direction in which the second member 114 projects out of the first member 112, by a compression coil spring 136 as a spring member as an elastic member as a sort of biasing device that is provided between the bottom of the fitting hole 130 and the pin 132. A limit of movement of the second member 114 by the biasing action of the spring 136 is defined by engagement of the pin 132 with one end of the elongate hole 134. Thus, the pin 132 and the elongate hole 134 cooperate with each other to provide a relative-rotation preventing device which prevents the second member 114 from being rotated relative to the first member 112, and provide a movement-limit defining device which defines the limit of movement of the second member 114 by the biasing action of the spring 136.

A lower end portion of the second member 114 that projects downward from the first member 112 and provides a lower end portion of the suction nozzle 110, provides a tapered suction portion 140 whose diameter decreases in a direction toward the lower or tip end. The suction nozzle 110 sucks and holds the EC 44 at the end of the suction portion 140 thereof. The suction portion 140 is colored black, and absorbs a light which is emitted by a lighting device which will be described later. Since the suction portion 140 is tapered, the suction portion 140 prevents the light emitted by the lighting device, from being regularly reflected toward a reflecting device which will be described later.

When a negative pressure is supplied to the suction nozzle 110, the nozzle 110 sucks and holds the EC 44; and when the negative pressure is cut from the nozzle 110 and a positive pressure is supplied to the nozzle 110, the nozzle 110 releases the EC 44. To this end, as shown in FIGS. 5 and 6, the suction nozzle 110 is supplied with the negative and positive pressures via an air-passage forming member 150, and a switch valve device 152 supplies and cuts each of the negative and positive pressures to and from the suction nozzle 110.

The air-passage forming member 150 is composed of three cylindrical members having different diameters, for easier production purposes, and those three members which are concentrically and integrally assembled with one another function as the integral air-passage forming member 150. A lower portion of the air-passage forming member 150 is fitted in the rotatable body 90, such that the rotatable body 90 is rotatable relative to the forming member 150, and an upper end portion of the forming member 1.50 is fitted in, and fixed to, a port forming portion 154 of the Y-axis slide 60. Thus, two portions of the air-passage forming member 150 that are axially distant from each other, are supported by the Y-axis slide 60 and the rotatable body 90, respectively, such that an axis line of the forming member 150 is vertical (i.e., upward-downward direction).

The air-passage forming member 150 has an axial passage 156 extending along the axis line of the member; an annular positive-pressure supply passage 158 surrounding the axial passage 156; and an annular negative-pressure supply passage 160 having a diameter greater than the positive-pressure supply passage 158. The three passages 156, 158, 160 are fluid-tightly isolated from one another.

The axial passage 156 is connected to a positive-pressure supply source and a negative-pressure supply source (both not shown) via a port 162 and a solenoid-operated direction-switch valve 164 (FIG. 12); the positive-pressure supply passage 158 is connected to the positive-pressure supply source via a port 166; and the negative-pressure supply passage 160 is connected to the negative-pressure supply source via a port 168. The axial passage 156 is, upon switching of the solenoid valve 164, selectively communicated with one of the positive-pressure supply source and the negative-pressure supply source, or placed in a state in which the passage 156 is not communicated with either of the two supply sources. The positive-pressure supply passage 158 and the negative-pressure supply passage 160 are always communicated with the positive-pressure supply source and the negative-pressure supply source, respectively, at least during the operation of the EC mounting system 46. The ports 162, 166, 168 are formed in the port forming portion 154.

The sixteen switch valve devices 152 are provided in association with the sixteen suction nozzles 110, respectively. In the present embodiment, the EC mounting system 46 has the plurality of (sixteen) switch valve devices 152. Since the switch valve devices 152 have an identical construction, one of them will be described below as a representative thereof.

Figure 7:
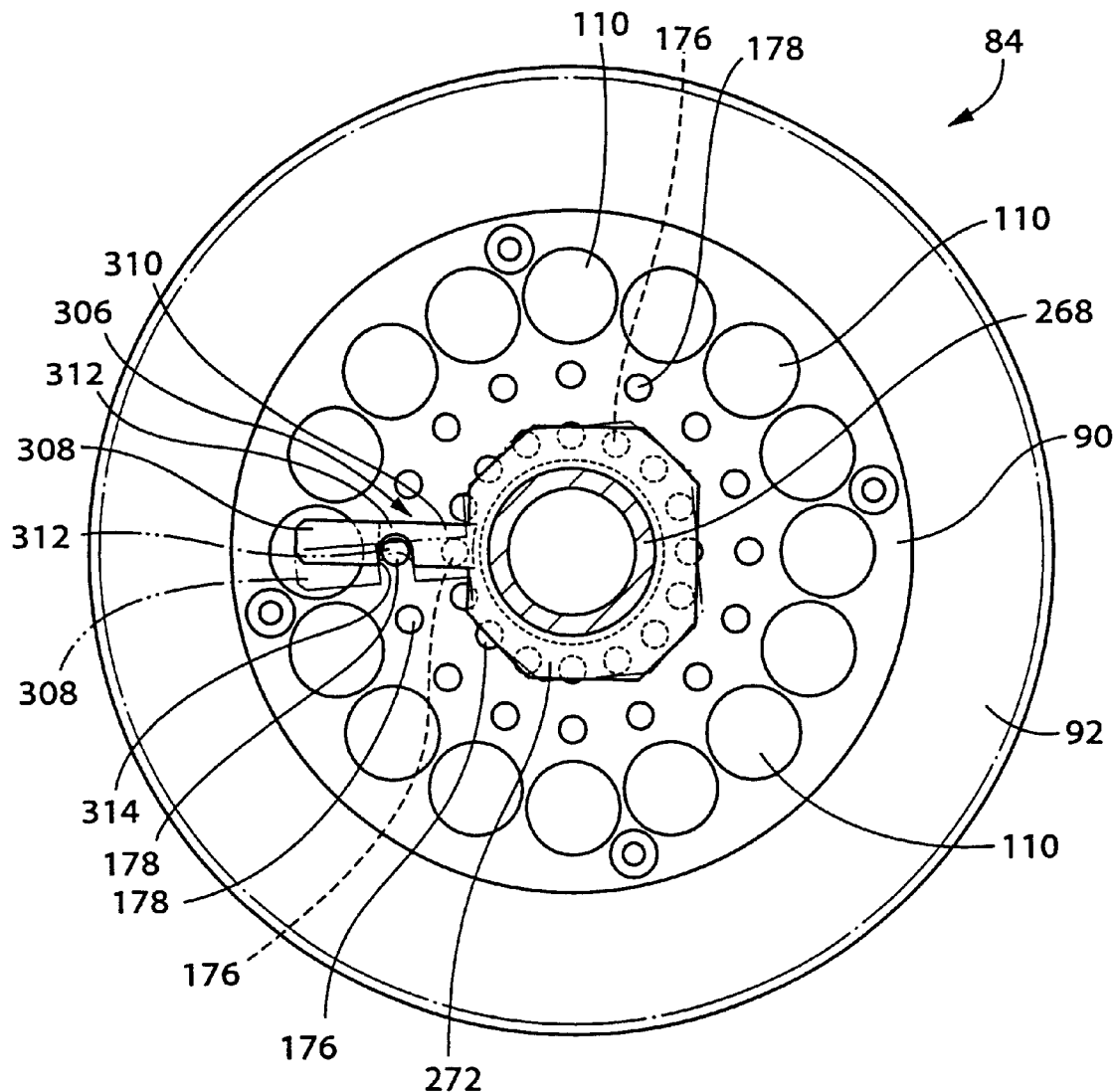
FIG. 7 is a plan view of the suction nozzles and the rotatable body of the EC mounting machine.

As shown in FIG. 8, the switch valve device 152 includes a first open/close valve 170, a second open/close valve 172, and a direction-switch valve he first open/close value 170 and the direction-switch valve 174 are spool valves and include spools 176, 178, respectively. The rotatable body 90 has a plurality of in the present embodiment, sixteen) first spool holes long a circle whose center is located on the axis line of the body 90 and which is smaller than the circle along which the suction nozzles 110 are provided. The first spool holes 180 are formed through the rotatable body 90 in a direction parallel to the axis line of the body 90. In addition, the rotatable body 90 has a plurality of (in the present embodiment, sixteen) second spool holes 182 along a circle whose center is located on the axis line of the body 90 and which is smaller than the circle along which the suction nozzles 110 are provided and is greater than the circle along which the first spool holes 180 are provided. The second spool holes 182 are formed through the rotatable body 90 in a direction parallel to the axis line of the body 90. Each of the sixteen first spool holes 180 and a corresponding one of the sixteen second spool holes 182 have a same position in a circumferential direction of the rotatable body 90. The first spool 176 is axially slideably fitted in the first spool hole 180, and the the second spool 178 is axially slideably fitted in the second spool hole 182. Thus, as shown in FIG. 7, the first spools 180 and the second spools 182 are provided along the two circles whose centers are located on the axis line of the rotatable body 90 and which have different radii, such that each of the first spools 180 and a corresponding one of the second spools 182 have a same position in the circumferential direction of the body 90 and are aligned with each other in a radial direction, and such that each of the first and second spools 180, 182 is vertically movable. In FIG. 7, the air-passage forming member 150 is not shown for easier understanding purposes only.

Respective lower end portions as respective one end portions of the first and second spools 176, 178 project downward from the side of the rotatable body 90 toward the side of the suction portion 140 of the suction nozzle 110, and are provided with large-diameter head portions 186, 188, respectively, which provide respective butting portions each as an engaging portion. Respective positions where the head portions 186, 188 butt on the rotatable body 90 are respective upper-dead positions as respective movement-end positions of the first and second spools 176, 178. Respective upper end portions as the respective other end portions of the first and second spools 176, 178 are interference-fitted in respective friction rings 190, 192 which are immovably held by the body 90. As shown in FIG. 8, the friction rings 190, 192 are fitted in a fitting hole 198 opening in an upper surface of the rotatable body 90, are pressed against inner surfaces of the fitting hole 198 and the spools 176, 178, and are made immovable by the driven wheel 92 fixed to the body 90.

The friction rings 190, 192 prevent, owing to the friction forces produced between the rings 190, 192 and the spools 176, 178, the spools 176, 178, respectively, from moving downward because of gravity exerted thereto. When respective forces which overcome the friction forces produced between the rings 190, 192 and the spools 176, 178 are applied to the spools 176, 178, the friction ring 190 192 permit the spools 176, 178 to move upward or downward. In the present embodiment, the friction rings 190, 192 provide respective spool-downward-movement preventing devices which can hold the spools 176, 178 at respective arbitrary positions in a direction parallel to the axis line of the rotatable body 90, and accordingly can hold the spools 176, 178 at the above-indicated respective upper-dead positions thereof, or at respective lower-dead positions thereof which will be described later. In the state in which the spools 176, 178 are held at their respective upper-dead positions, the upper end portions of the spools 176, 178 project upward through the driven wheel 92, thereby providing respective butting portions 194, 196 as respective engaging portions different from the head portions 186, 188 as the engaging portions.

In the rotatable body 90, a negative-pressure passage 200 which supplies a negative pressure to the suction nozzle 110, and a positive-pressure passage 202 which supplies a positive pressure to the suction nozzle 110 are formed such that each of the two passages 200, 202 perpendicularly intersects respective axis lines of the first and second spool holes 180, 182 and passes through the first open/close valve 170 and the direction-switch valve 174 in series. The positive-pressure passage 202 is spaced from the negative-pressure passage 200 in a direction parallel to the axis line of the rotatable body 90 (in the present embodiment, on a lower side of the negative-pressure passage 200). Respective diameters of the two passages 200, 202 are smaller than those of the spools 176, 178, and one end portion of the negative-pressure passage 200 opens in the holding hole 116 and the other end portion of the same 200 is communicated with the negative-pressure supply passage 160 formed in the air-passage forming member 150. One end portion of the positive-pressure passage 202 opens in the holding hole 116 and the other end portion of the same 202 is communicated with the positive-pressure supply passage 158.

Figure 9:
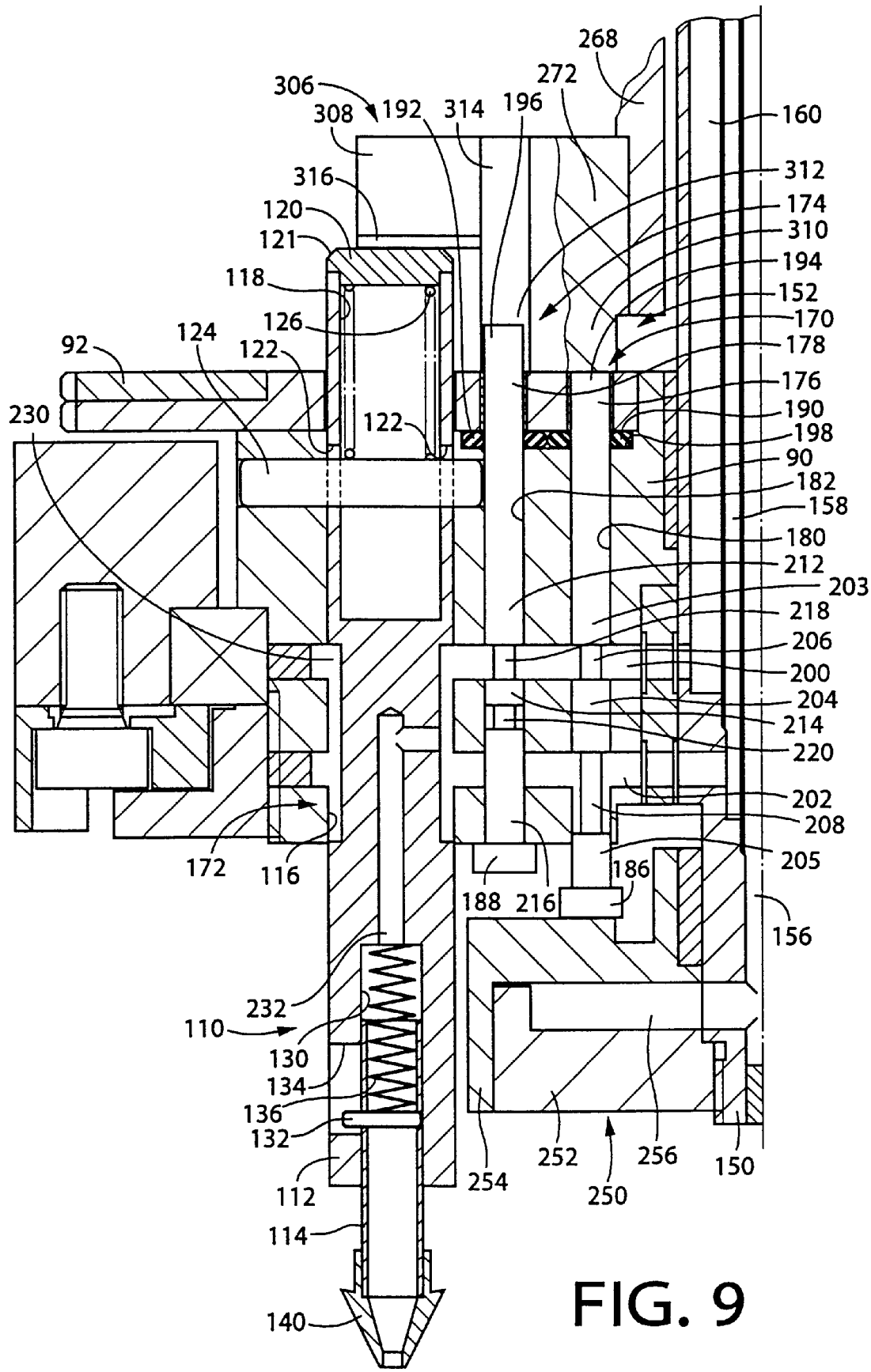
FIG. 9 is a cross-sectioned, front elevation view of the switch valve device of the EC mounting machine in a state in which a first open/close valve of the switch valve device closes a negative-pressure passage.

As shown in FIG. 8, the first has spool 176 has a first, a second, and a third land portion 203, 204, 205 and a first and a second small-diameter portion 206, 208. In the state in which the first spool 176 is positioned at its upper-dead position, the second land portion 204 shuts off the negative-pressure passage 200; and when the first spool 176 is moved to, and positioned at, its lower-dead position, the first small-diameter portion 206 opens the negative-pressure passage 200, as shown in FIG. 9. Whether the first spool 176 may be positioned at its upper-dead or lower-dead position, the second small-diameter portion 268 opens the positive-pressure passage 202.

Figure 10:
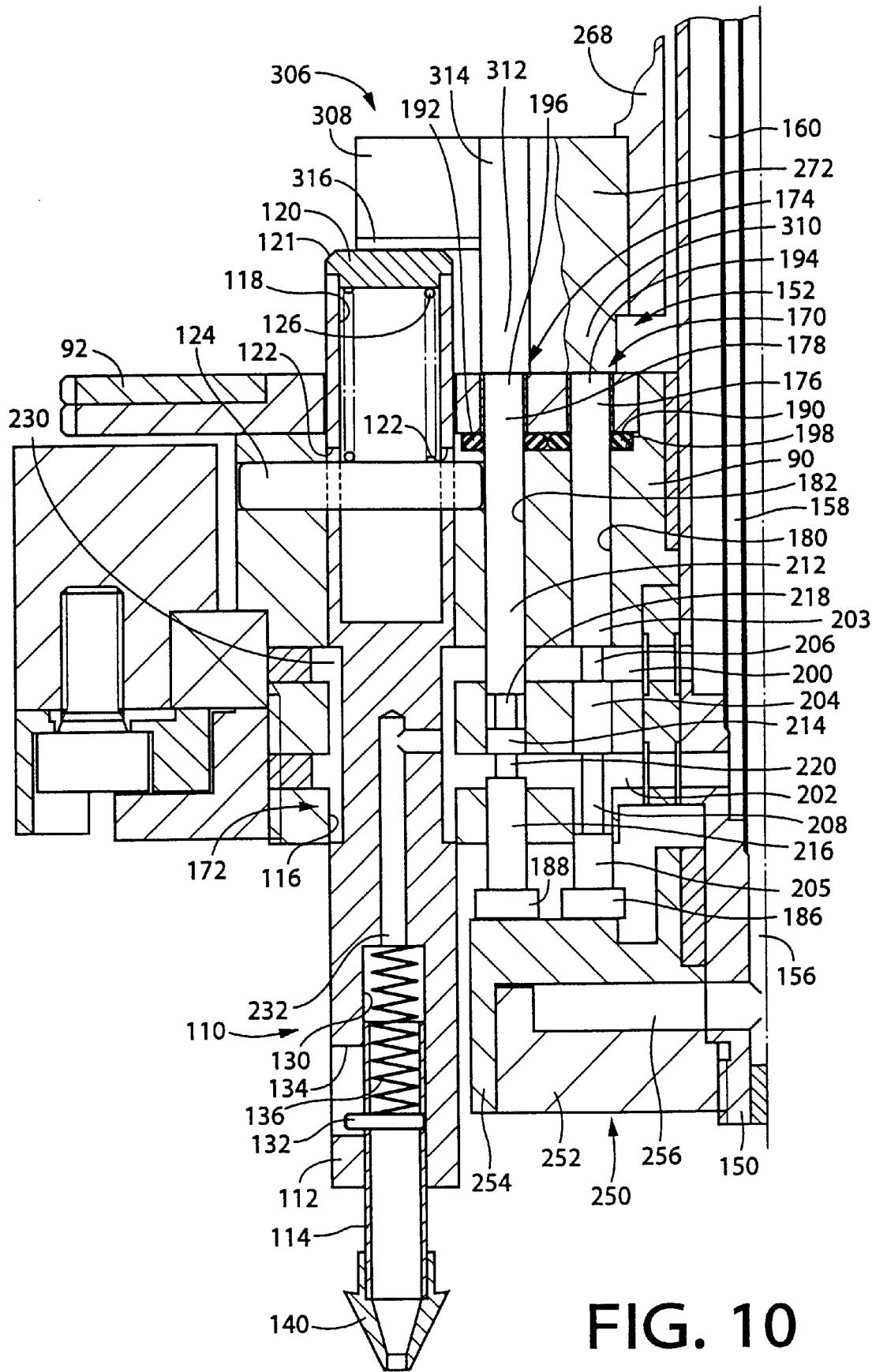
FIG. 10 is a cross-sectioned, front elevation view of the switch valve device in a state in which a direction-switch valve closes the negative-pressure passage and opens a positive-pressure passage.

As shown in FIG. 8, the second spool 178 has a first, a second, and a third land portion 212, 214, 216 and a first and a second small-diameter portion 218, 220. In the state in which the second spool 178 is positioned at its upper-dead position, the first small-diameter portion 218 opens the negative-pressure passage 200 and the third land portion 216 shuts off the positive-pressure passage 202; and when the second spool 178 is positioned at its lower-dead position, the first land portion 212 shuts off the negative-pressure passage 200 and the second small-diameter portion 220 opens the positive-pressure passage 202, as shown in FIG. 10.

As shown in FIG. 8, an annular passage 230 is formed in an outer circumferential surface of the first member 112 of the suction nozzle 110, and is communicated with the second member 114 via an axial passage 232 formed in the first member 112. As shown in FIG. 8, in the state in which the suction nozzle 110 is positioned at its upper-dead position, the annular passage 230 is communicated with the negative-pressure passage 200, but is not communicated with the positive-pressure passage 202; and as shown in FIGS. 9 and 10, in the state in which the suction nozzle 110 is positioned at its lower-dead position, the annular passage 230 is communicated with both the two passages 200, 202. The lower-dead position of the suction nozzle 100 corresponds to a position where the nozzle 110 contacts the EC 44 held by the EC-supply feeder 30, for sucking and holding the EC 44, and a position where the EC 44 held by the nozzle 110 contacts the PWB 20 for being mounted on the PWB 20.

Thus, as shown in FIG. 8, in the state in which both the first and second spools 176, 178 are positioned at their upper-dead positions, the first open/close valve 170 closes or shuts off the negative-pressure passage 200 and the direction-switch valve 174 opens the same 200 and shuts off the positive-pressure passage 202, so that the suction nozzle 110 is not communicated with either the negative-pressure source or the positive-pressure source. When the first spool 176 of the first open/close valve 170 is lowered from this state to its lower-dead position, as shown in FIG. 9, the first small-diameter portion 206 is moved to inside the negative-pressure passage 200 to completely open the same 200. Thus, whether the suction nozzle 110 may be positioned at its upper-dead or lower-dead position, the nozzle 110 is communicated with the negative-pressure source via the annular passage 230, the negative-pressure passage 200, and the negative-pressure supply passage 160, and is supplied with the negative pressure. When the second spool 178 of the direction-switch valve 174 is lowered from this state to its lower-dead position, as shown in FIG. 10, the first land portion 212 shuts off the negative-pressure passage 200, and the second small-diameter portion 220 is moved to inside the positive-pressure passage 202 to open the same 202. Thus, whether the first spool 176 may be positioned at its upper-dead or lower-dead position, the second small-diameter portion 208 is positioned inside the positive-pressure passage 202 to open the same 202, so that the suction nozzle 110 being positioned at its lower-dead position is disconnected from the negative-pressure source on one hand and is communicated on the other hand with the positive-pressure source via the annular passage 230, the positive-pressure passage 202, and the positive-pressure supply passage 158, so as to be supplied with the positive pressure. That is, when the direction-switch valve 174 is switched to a state in which the valve 174 cuts off the supplying of the negative pressure to the suction nozzle 110, the switch valve device 152 is switched to a state in which the device 152 permits the positive pressure to be supplied to the nozzle 110.

When the suction nozzle 110 is elevated to its upper-dead position in the state in which both the first and second spools 176, 178 are positioned at their lower-dead positions, the annular passage 230 is disconnected from the positive-pressure passage 202 and the first member 112 closes the same 202, so that the supplying of the positive pressure to the suction nozzle 110 is cut off. Thus, the first open/close valve 170 provides a first switch valve; the direction-switch valve 174 provides a second switch valve; and the first member 112 provides the second open/close valve 172 as an open/close valve which opens and closes the positive-pressure passage 202. The second open/close valve 172 is a spool valve which includes the first member 112 as a spool, and the holding hole 116 as a spool hole. A portion of the first member 112 in which the annular passage 230 is formed provides a small-diameter portion; and two portions of the first member 112 that are located on both sides of the small-diameter portion are two land portions. Alternatively, it can also be said that the direction-switch valve 174 includes two open/close valves and the switch valve device 152 includes four open/close valves.

As shown in FIG. 5, a lower end portion of the air-passage forming member 150 projects downward from the rotatable body 90, and is provided with a returning device 250 which returns the first open/close valve 170 and the direction-switch valve 174 to their initial positions where the two valves 170, 174 are positioned at their upper-dead positions and accordingly the suction nozzle 110 is disconnected from both the negative-pressure and positive-pressure sources. A circular plate 252 is fixed to the lower end portion of the air-passage forming member 150, and a drive member 254 as a returning member that has a circular cross section is air-tightly fitted on the circular plate 252, such that the drive member 254 is movable relative to the plate 252 in an axial direction thereof, so that an air chamber 256 is provided between the circular plate 252 and the drive member 254. The air chamber 256 is communicated with the axial passage 156 formed in the air-passage forming member 150. Therefore, when the air chamber 256 is supplied with air, the drive member 254 is move upward, i.e., moved relative to the forming member 150 in a direction toward the rotatable body 90, so that the drive member 254 simultaneously engages the respective head portions 186, 188 of the first and second spools 176, 178 being positioned at their lower-dead positions and at the same time causes the spools 176, 178 to move to their upper-dead positions, thereby returning the first open/close valve 170 and the direction-switch valve 174 to their initial positions. When the solenoid valve 164 is switched and accordingly the air chamber 256 is communicated with the negative-pressure source, the drive member 254 is attracted toward the circular plate 252 and is returned to its lower-dead position as its inoperative position. At the lower-dead position of the drive member 254, the drive member 254 is opposed to, and spaced a small distance from, the respective head portions 186, 188 of the spools. 176, 178 being positioned at their lower-dead positions.

A rotatable shaft 268 is provided outside an intermediate portion of the air-passage forming member 150 that is located between two portions of the same 150 that are supported by the rotatable body 90 and the port forming member 154, respectively, such that the rotatable shaft 268 is concentric with the forming member 150 and a small clearance is provided between the shaft 268 and the member 150. The rotatable shaft 268 is fitted in a sleeve 270, such that the shaft 268 is not rotatable relative to the sleeve 270 and is movable relative to the same 270 in an axial direction of the shaft 268. The sleeve 270 is held by the Y-axis slide 60 such that the sleeve 270 is rotatable relative to the slide 60, about the same axis line as that of the rotatable body 90, and is not movable relative to the slide 60 in an axial direction of the sleeve 270. A lower end portion of the rotatable shaft 268 projects downward from the sleeve 270, and is located above the rotatable body 90. A butting member 272 as an engaging member is fixed to the lower end portion of the shaft 268. This, the butting member 272 is supported by the rotatable shaft 268, such that the butting member 272 is rotatable relative to the rotatable body 90 about the axis line of the body 90 and is movable relative to the body 90 in a direction parallel to the axis line of the body 90. Though in the present embodiment the butting member 272 is provided separately from the rotatable shaft 268 and then is fixed to the shaft 268, the butting member 272 may be provided as an integral portion of the shaft 268.

The sleeve 270 is provided with a driven wheel 274 which is concentric, and integral with the sleeve 270 and which is meshed with a drive wheel 278 which is rotated by a butting-member rotating motor 276 which is provided on the Y-axis slide 60. The rotation of the butting-member rotating motor 276 is transmitted to the sleeve 270 via the drive wheel 278 and the driven wheel 274, so that the rotatable shaft 268 and the butting member 272 are rotated relative to the rotatable body 90 about the axis line of the body 90 by an arbitrary angle in each of opposite directions, and thus rotated to an arbitrary rotation phase. In the present embodiment, the butting-member rotating motor 276, the driven wheel 274, the drive wheel 278, the sleeve 270, and the rotatable shaft 268 cooperate with one another to provide a butting-member rotating device 280 as an engaging-member rotating device.

An engaging arm 282 as an engaging member is fitted on an upper end portion of the rotatable shaft 268 that projects upward from the sleeve 270, such that the engaging arm 282 is rotatable relative to the shaft 268 and is not movable relative to the same 268 in an axial direction of the same 268. As shown in FIG. 6, the Y-axis slide 60 supports a screw shaft 284 such that the screw shaft 284 is rotatable about a vertical axis line parallel to the axis line of the rotatable body 90 and is not movable in an axial direction thereof. A nut 286 is threadedly engaged with the screw shaft 284. An end portion of the engaging arm 282 that projects from the rotatable shaft 282 is fixed to the nut 286, so that the rotation of the nut 286 is prevented and the shaft 268 is supported by the Y-axis slide 60 via the engaging arm 282, the nut 286, and the screw shaft 268 such that the shaft 268 is movable relative to the slide 60 in a direction parallel to the axis line of the rotatable body 90 and is rotatable relative to the slide 60 about the same axis line. The screw shaft 284 is rotated by rotation of a butting-member moving motor 294 that is transmitted to the shaft 284 via a driven pulley 288 as a timing pulley, a drive pulley 290, and a timing belt 292, so that the nut 286 or the engaging arm 282 is moved up and down parallel to the axis line of the rotatable body 90 and the rotatable shaft 268 and the butting member 272 are moved relative to the body 90, up and down parallel to the axis line of the body 90. In the present embodiment, the rotatable shaft 268, the screw shaft 284, the nut 286, the driven pulley 288, the drive pulley 290, the timing belt 292, and the butting-member moving motor 294 cooperate with one another to provide a butting-member moving device 296 as an engaging-member moving device.

The butting member 272 is common to the sixteen suction nozzles 110 and, as shown in FIGS. 6 and 7, includes a projecting portion 306 which extends from the rotatable shaft 268 in a radial direction of the shaft 268 to a position where the projecting portion 306 can be opposed to each of the suction nozzles 110. A free end portion of the projecting portion 306 provides a nozzle-butting portion 308 as a nozzle-engaging portion. As shown in FIG. 8, a lower end portion of the nozzle-butting portion 308 that is one of opposite end portions of the same 308 that can be opposed to each suction nozzle 110 has two guide surfaces 316 (only one guide surface 316 is shown) at two locations, respectively, which are distant from each other in a direction of rotation of the butting member 272. The two guide surfaces 316 are so inclined as to approach each other in a downward direction.

When the butting member 272 is rotated by the butting-member rotating device 280 to an arbitrary rotation phase about the axis line of the rotatable body 90, the nozzle-butting portion 308 is revolved to an arbitrary rotation position where the butting portion 308 can engage, by butting, one of the sixteen suction nozzles 110 at an arbitrary rotation phase of the body 90 In addition, when the butting member 272 is lowered by the butting-member moving device 296, the nozzle-butting portion 308 engages, by butting, one of the sixteen suction nozzles 110, and lowers the one nozzle 110 against the biasing force of the compression coil spring 126, thereby moving the one nozzle 110 toward the board supporting device 24. When the nozzle-butting portion 308 is elevated, the one nozzle 110 is permitted to move upward, so that the one nozzle 110 is moved up by the biasing action of the spring 126, in a direction away from the board supporting device 24. In the present embodiment, the spring 126, the butting member 272, the butting-member rotating device 280, and the butting-member moving device 296 cooperate with one another to provide a nozzle moving device which moves each suction nozzle 110 toward, and away from, the board supporting device 24 in a direction (i.e., a vertical direction) perpendicular to the horizontal, movement plane. For sucking and holding an EC 44, the butting member 272 is elevated and lowered, in a similar manner, to move each suction nozzle 110 toward the EC 44 and permit the nozzle 110 to be moved away from the EC-supply feeder 30. In the present embodiment, the butting member 272 is vertically moved by a same stroke both in sucking and holding an EC 44 and in mounting the EC 44.

An upper-dead position of the butting member 272 is determined such that in a state in which the nozzle-butting portion 308 is positioned at a rotation position corresponding to each suction nozzle 110, a small clearance is left between the butting portion 308 and the each nozzle 110 being positioned at its upper-dead position, in a direction parallel to the axis line of the rotatable body 90. However, this clearance may not he left because of manufacturing errors, so that when the butting member 272 is rotated, the nozzle-butting portion 308 may butt against an upper end portion of the each nozzle 110. Even in this case, the guide surface 121 of the cap 120 of the each nozzle 110 cooperates with the guide surfaces 316 of the nozzle-butting portion 308 to guide the butting portion 308 so as to push slightly the each nozzle 110 downward against the biasing force of the spring 126 and thereby allow the butting portion 308 to be stopped on the each nozzle 110 or pass over the same 110. Thus, the nozzle-butting portion 308 is prevented from colliding with the nozzle 110 and being damaged because of the collision. Thus, the guide surfaces 121 of the caps 120 of the suction nozzles 110 and the guide surfaces 316 of the nozzle-butting portion 308 cooperate with each other to provide a guide portion or a guiding device which cooperates with means for supporting each suction nozzle 110 such that the each nozzle 110 is movable relative to the rotatable body 90 in the axial direction of the each nozzle 110, and with the spring 126 which biases the each nozzle 110, to provide a collision preventing device.

An intermediate portion of the projecting portion 306 that is other than the nozzle-butting portion 308 thereof, includes a downward projection projecting downward from both the butting portion 308 and a base portion of the projecting portion 306 that is fitted on the rotatable shaft 268. The downward projection includes, at respective locations thereof corresponding to the first and second spools 176, 178 in a radial direction of the shaft 268, a first and a second valve-butting portion 310, 312 each as a valve-engaging portion. As shown in FIG. 7, the projecting portion 306 has a cutout 308 which opens in one of opposite side surfaces of the portion 306 that are opposite to each other in the direction of rotation of the butting member 272, and which is formed through the thickness of the portion 306 in a direction parallel to the axis line of the body 90. A portion of the projecting portion 306 that defines the cutout 314 provides the second valve-butting portion 312. A portion of the first valve-butting portion 310 that butts on the first spool 176, and the second valve-butting portion 312 have different positions in the circumferential direction of the rotatable body 90. Therefore, when the butting member 272 i-s rotated relative to the rotatable body 90, the first or second valve-butting portion 310 or 312 can engage the butting portion 194 or 196 of the first or second spool 176 or 178, respectively. That is, when the butting member 272 is rotated and accordingly the projecting portion 306 is revolved about the axis line of the rotatable body 90, the projecting portion 306 is selectively positioned relative to each suction nozzle 110 which is about to suck or mount the EC 44, at a first relative rotation position, indicated in solid line in FIG. 7, where the first valve-butting portion 310 is opposed to the first spool 176 of the switch valve device 152 associated with the each nozzle 110, and at a second relative rotation position, indicated in two-dot chain line, where the second valve-butting portion 312 is opposed to the second spool 178 of the same device 152.

A width of the nozzle-butting portion 308 (i.e., a dimension of the same 308 in the direction of revolution of the projecting portion 306) is determined such that whether the projecting portion 306 may be positioned at the above-indicated first or second relative rotation position, the projecting portion 306 can butt on a portion of each suction nozzle 110 that includes the axis line thereof. A distance between the valve-butting portions 310, 312 and the spools 176, 178 being positioned at their upper-dead positions, is greater than the distance between the nozzle-butting portion 308 and each suction nozzle 110 being positioned at its upper-dead position. Therefore, when the butting member 272 is lowered, first, the nozzle-butting portion 308 butts on the suction nozzle 110.

As shown in FIGS. 1 and 4, two prisms 320 each as a reflecting device are fixed to the X-axis slide 50 (only one prism 320 is shown in FIG. 4). The two prisms 320 are supported by a lower portion of the X-axis slide 50, at two positions which correspond, in the Y-axis direction, to the two ball screws 56 for moving the X-axis slide 50, one of which is located between the one EC supplying device 26 and the board supporting device 24, and the other of which is located between the other EC supplying device 28.

The two prisms 320 have a same construction. Each prism 320 includes a casing 322 which is fixed to the X-axis slide 50, as shown in FIG. 4, and has a first reflecting surface 324 which is inclined, right below a path of movement of the EC mounting head 84 in the Y-axis direction, by about 45 degrees relative to a vertical plane including the central line (i.e., axis line) of the rotatable body 90, and whose lower end is more distant from the X-axis slide 50 than an upper end thereof. The prism 320 additionally has a second reflecting surface 326 which is provided right below a path of movement of the CCD camera 88 in the Y-axis direction, such that the second reflecting surface 326 is symmetrical with the first reflecting surface 324 with respect to a vertical plane. Thus, each prism 320 is opposed to the respective movement paths of the CCD camera 88 and the rotatable body 90. The first reflecting surface 324 functions as a half mirror which transmits an upward light and reflects almost all portions of a light reflected from the EC mounting head 84.

As shown in FIG. 4, a front light 330 as a lighting device is attached with an attaching member (not shown) to the X-axis slide 50, at a position below the first reflecting surface 324 of each prism 320. The front light 330 includes a PWB (printed-wiring board) 332 and a number of LEDs (light emitting diodes) 334 fixed to the PWB 332, and is provided in a horizontal posture. A light emitted by the front light 330 is transmitted through the first reflecting surface 324 to light a front surface of the EC 44, so that the CCD camera 88 takes a front-surface image of the EC 44.

A shutter 340 is fixed to an outer side surface of the casing 322 that is opposite to the X-axis slide 50. A dimension of the shutter 340 in the Y-axis direction is equal to those of the two reflecting surfaces 324, 326. An upper portion of the shutter 340 projects upward from the casing 322, and an end portion of the upper portion is bent toward the X-axis slide 50 in a horizontal direction so as to provide a shield portion 342 which projects into a space between the second reflecting surface 326 and the CCD camera 88. The shield portion 342 has a cutout 344 in a middle portion thereof in the Y-axis direction. Therefore, when the Y-axis slide 60 is moved in the Y-axis direction, the CCD camera 88 is moved on the shield portion 342 and, when passing over the cutout 344, receives the light reflected by the second reflecting surface 326. A dimension of the cutout 344 in the X-axis direction is so determined as to be enough to assure that an image-forming light reflected from the reflecting surface 326 passes through the cutout 344. A dimension of the cutout 344 in the Y-axis direction is so determined as to be equal to a length, vt, obtained as the product of a speed, v, of movement of the CCD camera 88 in the Y-axis direction and a time, t, of exposure.

Figure 11:
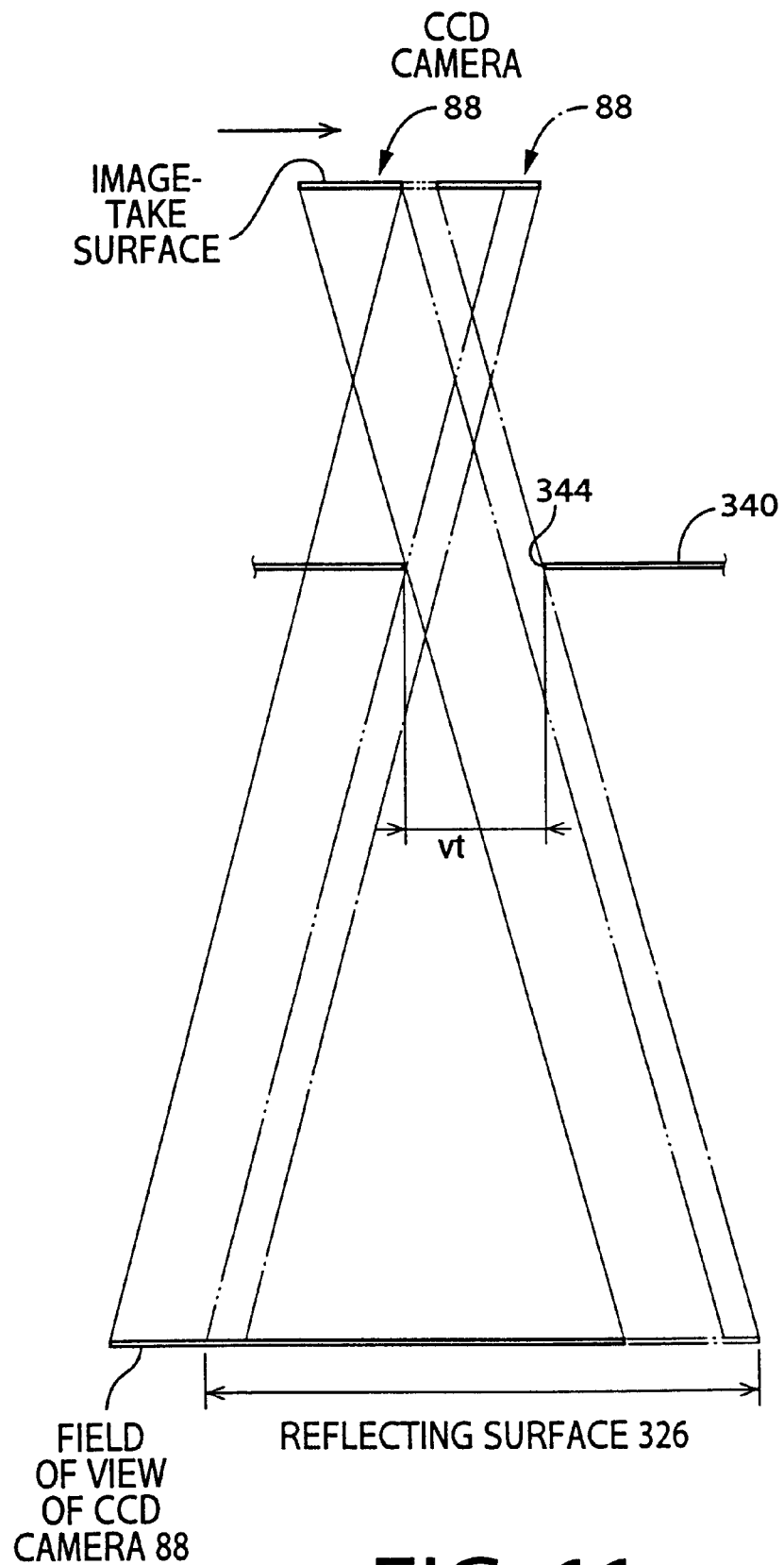
FIG. 11 is a view for explaining a manner in which an image taking device of the EC mounting machine takes an image of an EC.

As shown in FIG. 11, an image-take surface of the CCD camera 88 that is defined by a matrix of image-take elements receives a light which is reflected by the second reflecting surface 326 and is inverted try a lens. The CCD camera 88 has a field of view, indicated at solid line. When the CCD camera 88 is moved in the Y-axis direction, indicated at arrow in FIG. 11, the image-take surface receives lights from respective positions in the field of view. For example, regarding an upstream-side end of the image-take surface in a direction of movement of the surface, while the CCD camera 88 is moved from a position indicated at solid line to a position indicated at one-dot chain line, the image-take surface continues to receive, through the cutout 344, a light reflected from a downstream-side end of the field of view in a direction of movement of the field, so that the image-take elements of the image-take surface are exposed to the light. Therefore, if the length of the cutout 344 in the Y-axis direction is determined to be equal to the length vt obtained as the product of the time t of exposure of the CCD camera 88 and the speed v of movement of the same 88, the image-take elements are exposed for the necessary time t and the CCD camera 88 can take an image of the EC 44.

Since the image-take surface of the CCD camera 88 receives a light reflected from the second reflecting surface 326, after the light is inverted by the lens, respective lengths of the first and second reflecting surfaces 324, 326 in the Y-axis direction need to be not less than a distance between a position, indicated at two-dot chain line, where a downstream-side end of the image-take surface in the direction of movement of the surface starts receiving the inverted light, and a position, indicated at one-dot chain line, where the upstream-side end of the image-take surface in the direction of movement of the surface finishes receiving the inverted light. To this end, the respective lengths of the reflecting surfaces 324, 326 are determined to be greater than the above-indicated distance. Those lengths of the reflecting surfaces 324, 326 change depending upon the length of the cutout 344 in the Y-axis direction, and may be smaller than that of the field of view of the CCD camera 88. In the present embodiment, however, the lengths of the reflecting surfaces 324, 326 are greater than that of the field of view.

The first and second reflecting surfaces 324, 326 of each prism 320 assure that respective lights forming respective images of the sixteen ECs 44 sucked and held by the sixteen suction nozzles 110 are simultaneously introduced into the image taking device 88, and the image taking device 88 is one which can simultaneously take the respective images of the sixteen ECs 44. The front light 330 is one which continues to emit a light toward the sixteen ECs 44 while the image taking device 88 takes the respective images of the sixteen ECs 44.

Figure 12:
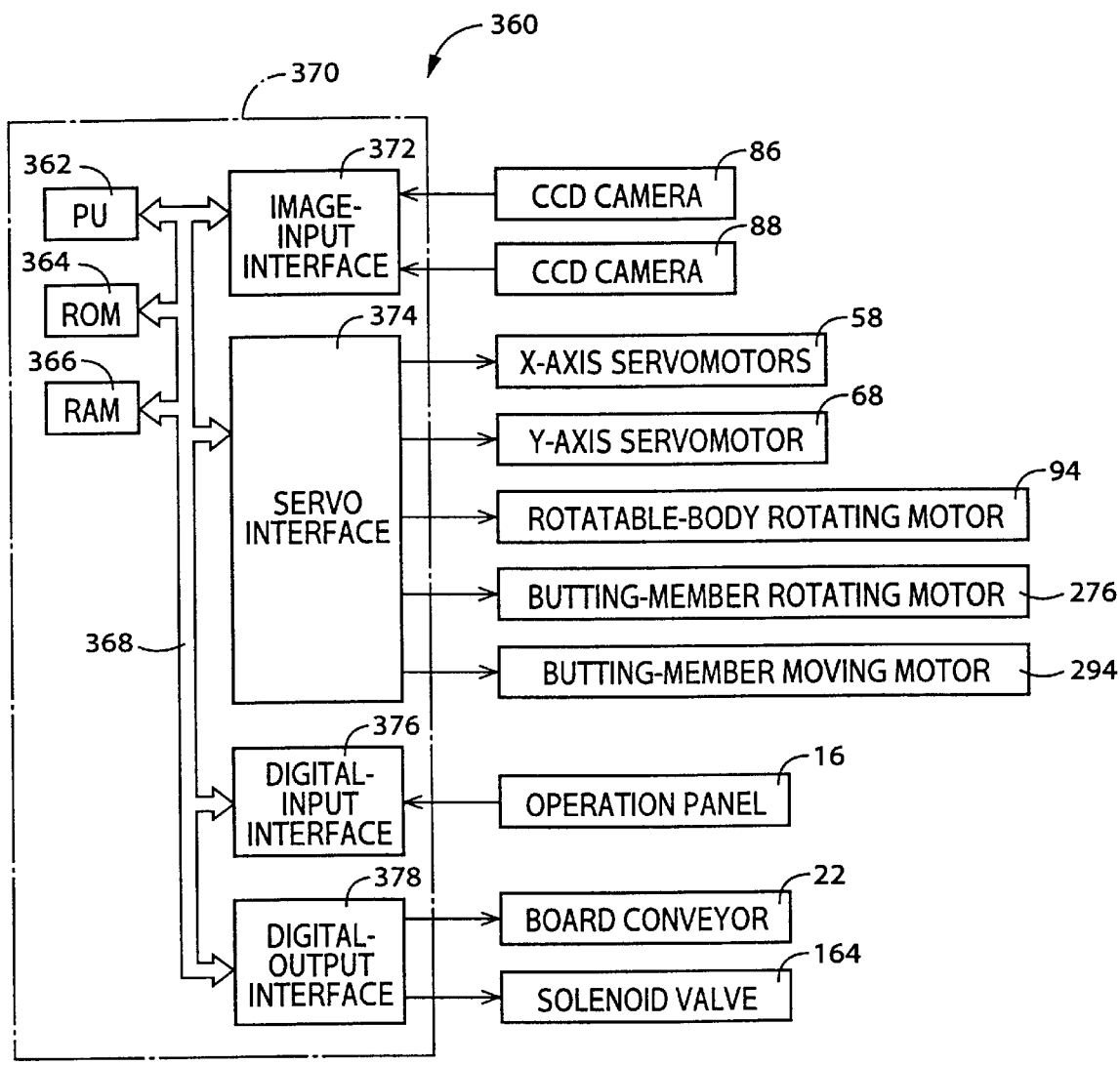
FIG. 12 is a diagrammatic view of a relevant portion of a control device of the EC mounting machine.

The present EC mounting machine is controlled by a control device 360 as a control means that is shown in FIG. 12. The control device 360 is essentially provided by a computer 370 including a processing unit ("PU") 362, a read only memory ("ROM") 364, a random access memory ("RAM") 366, and a bus 368 which couples those elements 362, 364, 366 to one another. An image-input interface 372 is coupled to the bus 368, and the two CCD cameras 86, 88 are connected to the image-input interface 372. A servo interface 374 is also coupled to the bus 368, and various actuators including the X-axis servomotors 58 are connected to the servo interface 374, so that the control device 360 can control the main moving device 82, the rotatable-body rotating device 102, and the nozzle moving device. In addition, a digital-input interface 376 is coupled to the bus 368, and the operation panel 16 is connected to the digital-input interface 376. Moreover, a digital-output interface 378 is coupled to the bus 368, and the board conveyor 22 and the solenoid valve 146 are connected to the digital-output interface 378. In addition to the X-axis servomotors 58 and the Y-axis servomotor 68, each of the rotatable-body rotating motor 94, the butting-member rotating motor 276, and the butting-member moving motor 294 is provided by a servomotor. The servomotor is a rotary motor as an electric motor as a sort of drive source, and is accurately controllable with respect to its rotation speed and angle. A stepper motor may be used in place of the servomotor.

Next, the operation of the EC mounting machine constructed as described above will be described.

When the ECs 44 are mounted on the PWB 20, first, the main moving device 62 moves the Y-axis slide 60, to move the sixteen suction nozzles 110 to the EC supplying device 26 (or 28). Then, as the rotatable body 90 is rotated, the sixteen suction nozzles 110 are sequentially moved to an EC-suck position where each nozzle 110 sucks and holds an EC 44. The EC-suck position is the position on a locus of revolution of each nozzle 110 that is the nearest to the EC-supply feeders 30 of the EC supplying device 26 (or 28). Before sucking the ECs 44, all the sixteen suction nozzles 110 are positioned at their upper-dead positions, the respective first and second spools 176, 178 of the sixteen switch valve devices 152 are positioned at their upper-dead positions, and the drive member 254 of the returning device 250 is positioned at its lower-dead position.

When the ECs 44 are sucked, the projecting portion 306 of the butting member 272 is revolved to a rotation position corresponding to one suction nozzle 110 being positioned at the EC-suck position, and a rotation phase corresponding to the first relative rotation position indicated in solid line in FIG. 7, the nozzle-butting portion 308 is positioned slightly above the one nozzle 110, and the first valve-butting portion 308 is positioned above the first valve spool 176. The second valve-butting portion 312 is not aligned with the second spool 178, and the recess 314 is positioned above the same 178.

After one suction nozzle 110 is revolved to the EC-suck position while being moved to above the EC-supply position of one EC-feeder 30 which is to supply the next EC 44, the butting member 272 is lowered by the butting-member moving device 296, so that the nozzle-butting portion 308 engages, by butting, the one nozzle 110, lowers the same 110 against the biasing force of the compression coil spring 126, and thereby moves the same 110 toward the EC 44. From a state in which the suction portion 140 of the one nozzle 110 just contacts the EC 44, the one nozzle 110 is further moved downward by a small distance, so that the one nozzle 110 is assuredly brought into contact with the EC 44 while an excessive downward movement of the one nozzle 110 is permitted or absorbed by the compression of the spring 136.

Since the distance between the first valve-butting portion 310 and the first spool 176 is longer than that between the nozzle-butting portion 308 and the one suction nozzle 110, the first valve-butting portion 310 does not butt on the first spool 176, immediately after the commencement of the downward movement of the butting member 272. However, as the butting member 272 is moved downward to move the one nozzle 110 toward the EC 44, the first valve-butting portion 310 engages, by butting, the butting portion 194 of the first spool 176, depresses the spool 176 against the friction force produced between the spool 176 and the friction ring 190, and thereby moves the same 176 to its lower-dead position. Consequently the first open/close valve 170 is switched to the state in which the valve 170 permits the supplying of the negative pressure to the one nozzle 110, and accordingly the one nozzle 110 is communicated with the negative-pressure source. Thus, immediately before the one nozzle 110 contacts the EC 44, the one nozzle 110 is supplied with the negative pressure and is enabled to suck and hold the EC 44. When the butting member 272 is lowered, the recess 314 prevents the interference of the projecting portion 306 and the second spool. 178. This, the second spool 178 is not lowered, and remains at its upper-dead position, so that the direction-switch valve 174 is not switched.

After the one suction nozzle 110 sucks and holds the EC 44, the butting member 272 is elevated to its upper-dead position by the butting-member moving device 296. The one nozzle 110 is also elevated because of the biasing action of the spring 126, so as to follow the butting member 272. Thus, the one nozzle 110 is returned to its upper-dead position. Because of the friction force produced between the first spool 176 and the friction ring 190, the first spool 176 remains at its lower-dead position to open the negative-pressure passage 200. Not only in the state in which the one nozzle 110 is positioned at its upper-dead position but also in the state in which the one nozzle 110 is positioned at its lower-dead position, the one nozzle 110 is communicated with the negative-pressure passage 200 via the annular passage 230, and accordingly the one nozzle 110 continues to hold the EC 44.

The sixteen suction nozzles 110 are sequentially moved to the EC-suck position where each nozzle 110 sucks an EC 44. During this, the butting member 272 remains, relative to the each nozzle 110 being positioned at the EC-suck position, in the state in which the projecting portion 306 thereof is positioned at the rotation phase corresponding to the first relative rotation position indicated in solid line in FIG. 7. After all the suction nozzles 110 suck and hold respective ECs 44, those nozzles 110 are moved to the PWB 20 by the main moving device 82, so as to mount the ECs 44 at predetermined EC-mount locations on the PWB 20. The sixteen suction nozzles 110 are moved to the EC-mount locations of the PWB 20, by the respective movements of the X-axis and Y-axis slides 50, 60. During this, the nozzles 110 passes through above one prism 320 fixed at a position between the EC-supply positions of the EC-supply feeders 30 and the EC-mount locations of the PWB 20.

Wherever the EC-supply positions of the EC supplying device 26 (or 28) and the EC-mount locations of the PWB 20 may be, the sixteen suction nozzles 110 must move, for moving from the EC-supply positions to the EC-mount locations, on the X-axis slide 50 in the Y-axis direction and pass through a position between the EC supplying device 26 (or 28) and the PWR 20. Therefore, if one prism 320 is fixedly provided at a position on the X-axis slide 50 between the EC-supply positions to the EC-mount locations, the sixteen suction nozzles 110 must pass through above the prism 320. The above description is also true with the case where the suction nozzles 110 suck the ECs 44 held by the EC supplying device 28.

The light emitted by one front light 330 to form a front-surface image of each EC 44, is reflected by the first reflecting surface 324 and then is reflected upward by the second reflecting surface 326. When the EC mounting head 84 including the rotatable body 90 and tile sixteen suction nozzles 110 passes through above one prism 320, the sixteen nozzles 110 move above the first reflecting surface 324 while the CCD camera 88 moves above the second reflecting surface 326. The two reflecting surfaces 324, 326 cause the respective lights reflected from all the sixteen ECs 44 to be incident to the image-take surface of the CCD camera 88 through the recess 344 formed in the shield portion 342 of the shutter 340, so that the CCD camera 88 simultaneously takes, based on those image-forming lights, respective images of all the sixteen ECs 44 held by the sixteen nozzles 110. Thus, the CCD camera 88 takes the images of the ECs 44 while the camera 88 is moved with the rotatable body 90.

The CCD camera 88 is provided with the rotatable body 90 on the Y-axis slide 60, and is moved with the ECs 44 held by the suction nozzles 110. Therefore, when the ECs 44 and the CCD camera 88 pass through above one prism 320, the image-forming lights reflected from the second reflecting surface 326 follow the camera 88, so that the camera 88 can take respective images of the ECs 44 as if the ECs 44 were still. Since the length of the recess 344 of the shutter 340 in the Y-axis direction is equal to the product of the exposure time of the camera 88 and the movement speed of the same 88, the image-take elements (i.e., (CCDs) of the camera 88 are sufficiently exposed to the image-forming lights and accordingly the camera 88 can simultaneously take respective images of the ECs 44.

The computer 370 compares image data representing the thus taken image of each of the ECs 44, with normal or reference image data free of EC-hold errors, i.e., center-position errors and a rotation-position error. The center-position errors are respective positional errors of the center position of the each EC 44 in two directions (e.g., the X-axis and Y-axis directions) perpendicular to each other on a horizontal plane parallel to the PWB 20. The rotation-position error is an angular error of the each EC 44 about a vertical axis line thereof. Thus, the computer 370 calculates the center-position errors, DX, DY, and rotation-position error, D$\theta$, of the each EC 44. The computer 370 calculates, in advance, based on the respective images of the plurality of (e.g., two) reference marks of the PWB 20 taken by the CCD camera 86, respective positional errors, DX', DY', of the PWB 20 in two directions (e.g., the X-axis and Y-axis directions) perpendicular to each other on the horizontal plane parallel to the PWB 20.

The center-position errors DX, DY of the each EC 44 and the positional errors DX', DY' of the PWB 20 are corrected by correcting the respective movement distances of the Y-axis slide 60 as the movable member in the X-axis and Y-axis directions. The rotation-position error D$\theta$ of the each EC 44 is corrected by rotating the rotatable body 90. The suction nozzles 110 are supported by the rotatable body 90 such that each nozzle 110 is not rotatable relative to the body 90. Therefore, the current rotation phase or position of the each EC 44 about the vertical axis line thereof can be changed by rotating the rotatable body 90, thereby revolving the suction nozzle 110 holding the each EC 44, and thereby changing the rotation position of that nozzle 110. In addition, when it is needed to change a rotation position with which each EC 44 is sucked and held by one nozzle 110, to a different rotation position with which the each EC 44 is to be mounted on the PWB 20, the rotatable body 90 is also rotated. The rotation position with which each EC 44 is mounted on the PWB 20 is determined in advance, and the rotatable body 90 is rotated according to the rotation position. When the rotation-position error D$\theta$ of each EC 44 is corrected and simultaneously the current rotation position of the each EC 44 is changed to a different rotation position, the rotatable body 90 is rotated by an angle capable of eliminating the rotation-position error DE and changing the current rotation position to the different rotation position.

If the rotation-position error D$\theta$ of each EC 44 is corrected and/or the current rotation position of the each EC 44 is changed to a different rotation position, the center position of the each EC 44 is moved by respective changes, DX", DY", in the X-axis and Y-axis directions. Those changes DX", DY" are corrected with the center-position errors DX, DY of the each EC 44 and the positional errors DX', DY' of the PWB 20, by correcting the respective movement distances of the Y-axis slide 60 in the X-axis and Y-axis directions. The rotatable body 90 is rotated while being moved to each EC-mount location on the PWB 20. Thus, the combination of the rotation of the body 90 and the movement of the Y-axis slide 60 causes each EC 44 to be positioned with a predetermined rotation position, at a position opposed to a corresponding predetermined EC-mount location on the PWB 20. A plurality of ECs 44 which are to be mounted with different rotation positions on the PWB 20, are positioned with those different rotation positions above the PWB 20. In the present embodiment, an EC-mount control program (pre-stored in the ROM 364) according to which the control device 360 controls the present EC mounting machine to mount the ECs 44 on the PWB 20, is prepared such that if the ECs 44 have no EC-hold errors and the PWB 20 has no positional errors DX', DY', the ECs 44 are mounted on the PWB 20 in an order which minimizes the total movement distance of the Y-axis slide 60 as the movable member in the X-axis and Y-axis directions, and the total rotation angle of the rotatable body 90.

While the rotatable body 90 is rotated to revolve the suction nozzles 110, the butting member 272 is rotated by the butting-member rotating device 280, so that the projecting portion 306 of the butting member 272 is revolved to a rotation position corresponding to one suction nozzle 110 holding the EC 44 to be mounted next, and a rotation phase corresponding to the second relative rotation position, indicated in two-dot chain line in FIG. 7, relative to the one nozzle 110. That is, the butting member 272 is rotated to a rotation phase where the projecting portion 306 thereof is positioned at the second relative rotation position relative to the one nozzle 110, so that the nozzle-butting portion 308 is aligned with the one nozzle 110 and the second valve-butting portion 308 is aligned with the second valve spool 178.

After each EC 44 is moved to a position right above a corresponding EC-mount location on the PWB 20 and the projecting portion 306 of the butting member 272 is revolved to a rotation phase corresponding to the second relative rotation position indicated in two-dot chain line in FIG. 7, the butting member 272 is lowered. During this, first, the nozzle-butting portion 308 contacts one suction nozzle 110, lowers the one nozzle 110 against the biasing force of the spring 126, and thereby moves the one nozzle 110 toward the board supporting device 24, so that the each EC 44 is mounted on the PWB 20. From the state in which the EC 44 just contacts the PWB 20, the butting member 272 is further moved downward by a small distance, so that the EC 44 is assuredly mounted on the PWB 20 and an excessive downward movement of the EC 44 is absorbed by the compression of the spring 136.

Since the distance between the second valve-butting portion 312 and the second spool 178 is greater than that between the nozzle-butting portion 308 and one suction nozzle 110, the second valve-butting portion 312 does not butt on the second spool 178, immediately after the commencement of the downward movement of the butting member 272. However, as the butting member 272 moves the one nozzle 110 toward the board supporting device 24, the second valve-butting portion 312 engages, by butting, the butting portion 196 of the second spool 178, and thereby depresses the second spool 178 to its lower-dead position against the friction force produced between the spool 178 and the friction ring 192. At a terminal end of the downward movement of the butting member 272, the direction-switch valve 174 cuts off the supplying of the negative pressure to the one nozzle 110, and is switched to the state in which the valve 174 permits the the supplying of the positive pressure to the one nozzle 110. The first spool 176 had been moved downward to its lower-dead position when this nozzle 110 was used to suck and hold an EC 44, and has been kept at its lower-dead position, so that the first valve-butting portion 310 cannot contact the first spool 176. Since the nozzle 110 is lowered to its lower-dead position, the nozzle 110 is communicated with the positive-pressure passage 202 via the annular passage 230, so that immediately before the EC 44 contacts the PWB 20, the nozzle 110 is cut off the supplying of the negative pressure and is supplied with the positive pressure, and accordingly can positively release the EC 44.

After the EC 44 is thus mounted on the PWB 20, the butting member 272 is elevated and the one suction nozzle 110 is also elevated to its tipper-dead position by the biasing action of the spring 126. Since (he one nozzle 110 is moved to its upper-dead position, the first member 112 of the nozzle 110 closes the positive-pressure passage 202, so as to cut off the supplying of the positive pressure to the one nozzle 110. On the other hand, since the second spool 178 is kept at its lower-dead position because of the friction force produced between the spool 178 and the friction ring 192, the negative-pressure passage 200 is not opened, i.e., remains closed.

Since the direction-switch valve 174 closes the negative-pressure passage 200 and the second open/close valve 172 closes the positive-pressure passage 202, the one suction nozzle 110 is kept in a state i n which the nozzle 110 is disconnected from both the negative-pressure source and the positive-pressure source. Therefore, after the EC 44 is mounted on the PWB 20 and accordingly a suction (lower) opening of the one nozzle 11.0 is opened, neither the negative nor positive pressure leaks from the suction opening. If another suction nozzle 110 is holding an EC 44, the nozzle 110 can continue to hold the EC 44.

Similarly, regarding the EC 44 to be next mounted on the PWB 20, the EC-hold errors thereof are corrected, and the EC 44 is positioned with a predetermined rotation position at above a corresponding EC-mount location on the PWB 20, by the combination of the rotation of the rotatable body 90 and the movement of the Y-axis slide 60. In addition, the butting member 272 is rotated by the butting-member rotating device 280, and accordingly the projecting portion 306 thereof is revolved to a rotation phase corresponding to the second relative rotation position, indicated in two-dot chain line in FIG. 7, relative to the suction nozzle 110 which holds the next. EC 44. When the butting member 272 is lowered, the nozzle 110 is lowered and the second spool 178 is lowered, so that: the next EC 44 is mounted on the PWB 20 and the direction-switch valve 174 is switched.

After all the suction nozzles 110 mount the respective ECs 44 on the PWB 20, the EC mounting head 84 is moved to the EC supplying device 26 (or 28), and newly takes ECs 44 from the EC-supply feeder or feeders 30 of the supplying device 26 (or 28). During this movement, the returning device 250 returns the first and second spools 176, 178 to their upper-dead positions. The air chamber 256 of the returning device 250 is normally communicated with the negative-pressure source and accordingly the drive member 254 is normally kept at its lower-dead position where the drive member 254 does not disturb the movements of the spools 176, 178 to their lower-dead positions. To return the spools 176, 178 to their upper-dead positions, the solenoid valve 164 is so switched that the air chamber 256 is communicated with the positive-pressure source and accordingly the drive member 254 is elevated to its operative position, i.e., its upper-dead position. The drive member 254 has a circular cross section whose radius is slightly greater than that of the circle along which the second spools 178 are provided, and accordingly can simultaneously engage, by butting, the respective head portions 186, 188 of the first and second spools 176, 178 of the sixteen switch valve devices 152, and can simultaneously move all the spools 176, 178 to their upper-dead position. Thus, the respective first open/close valves 170 and respective direction-switch valves 174 of the sixteen switch valve devices 152 are simultaneously returned to their initial positions, and then the solenoid valve 164 is switched to cause the air chamber 256 to be communicated with the negative-pressure source and the drive member 254 to be lowered to its lower-dead position. After the drive member 254 is lowered to its lower-dead position, the solenoid valve 164 is switched again to cause the air chamber 256 to be disconnected from both the positive-pressure source and the negative-pressure source and cause the drive member 254 to be held at its lower-dead position.

As is apparent from the foregoing description, in the present embodiment, the control device 360 provides a main control device; a portion of the control device 360 that controls the main moving device 82 and the rotatable-body rotating device 102 and thereby sequentially positions each of the respective ECs 44 held by the plurality of suction nozzles 110, with an arbitrary rotation position, at a position opposed to a corresponding EC-mount location on the PWB 20, provides a positioning control portion; and a portion of the control device 360 that controls the butting-member rotating device 280 and the butting-member moving device 296, thereby rotates and lowers the butting member 272, and thereby sequentially mounts each of the ECs 44 held by the plurality of suction nozzles 110 on the PWB 20, provides a mounting control portion. In addition, a portion of the control device 360 that processes the image taken by the CCD camera 88, determines the EC-hold errors of the EC 44 held by each of the suction nozzles 110, and controls the main moving device 82 and the rotatable-body rotating device 102 to eliminate the thus determined EC-hold errors, provides an EC-hold-error-elimination control portion.

Figure 13:
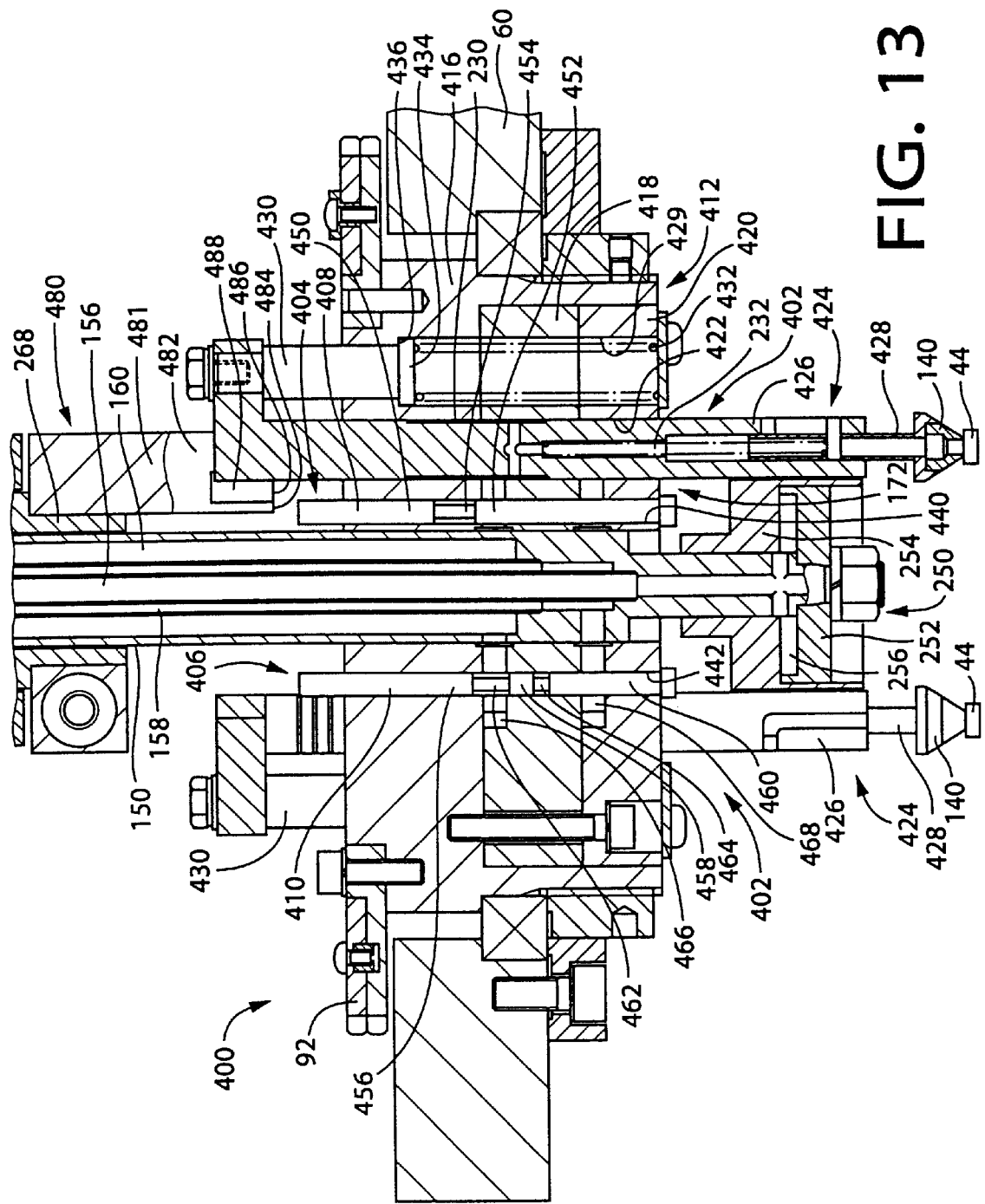
FIG. 13 is a cross-sectioned, front elevation view of a relevant portion of another EC mounting system as a second embodiment of the present invention.
Figure 14:
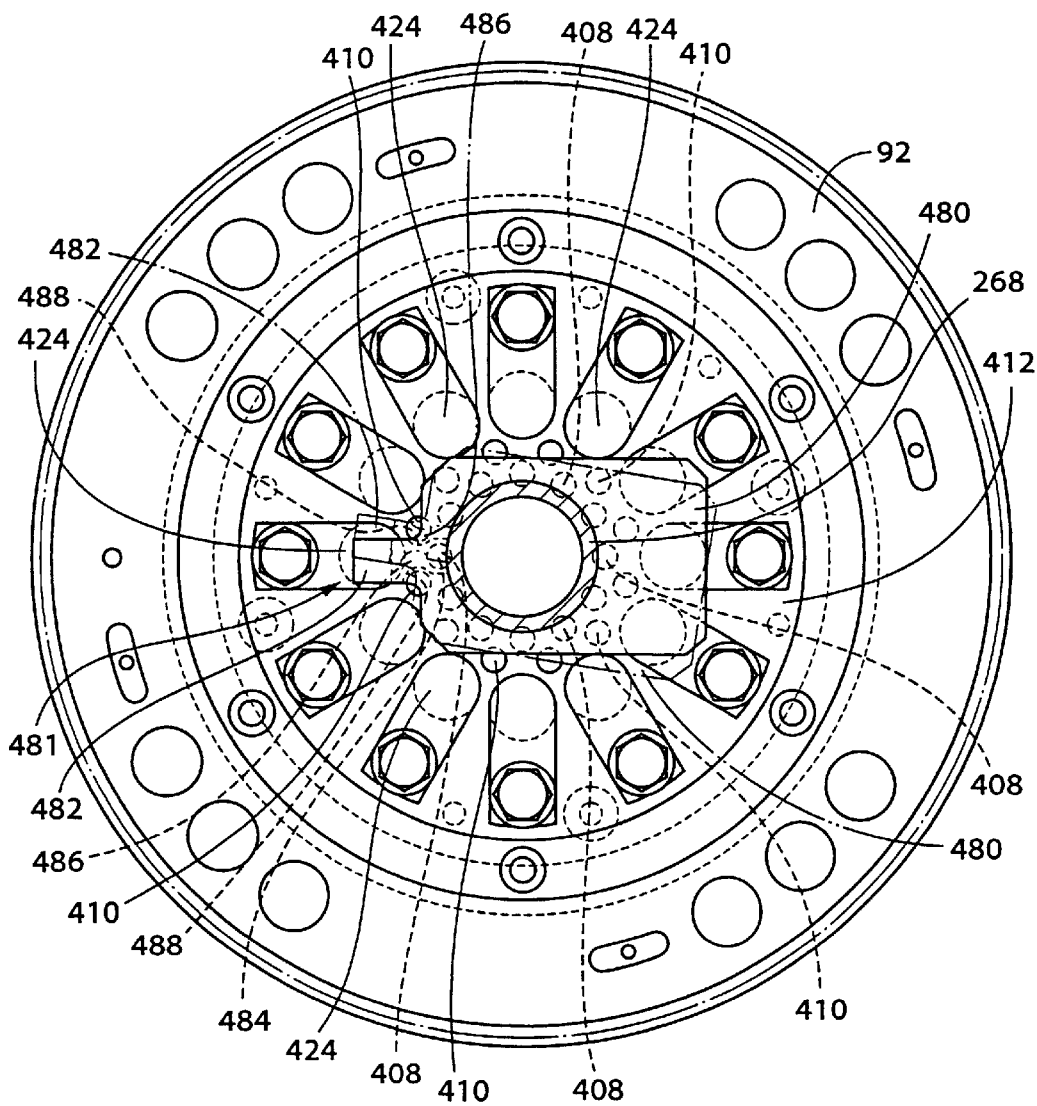
FIG. 14 is a plan view of suction nozzles and a rotatable body of the EC mounting system of FIG. 13.

Next, a second embodiment of the present invention will be described by reference to FIGS. 13 to 16. The second embodiment relates to an EC mounting system 400 wherein respective first spools 408 of respective first open/close valves 404 of switch valve devices 402 are provided along a first circle whose center is located on an axis line of a rotatable body 412, and respective second spools 410 of respective direction-switch valves 406 of the switch valve devices 402 are provided along a second circle whose center is located on the axis line of the rotatable body 412 and whose diameter is greater than that of the first circle, such that the first spools 408 and the second spools 410 are alternate with each other in a circumferential direction of the rotatable body 412, as shown in FIG. 14. In addition, in the EC mounting system 400, a positive pressure is applied to the first and second spools 408, 410 to prevent the spools 408, 410 from moving downward, because of gravity, from their upper-dead positions. The same reference numerals as used in connection with the EC mounting system 46 will be used to designate the corresponding elements and parts of the EC mounting system 400, and the description thereof is omitted.

The rotatable body 412 as part of an EC mounting head is provided by a first member 416, a second member 418, and a third member 420, which are assembled with one another into the integral rotatable body 412. That is, the three members 416, 418, 420, assembled with one another, function as the integral rotatable body 412. The rotatable body 412 has a plurality of (in the present embodiment, twelve) hold holes 422 which extend therethrough in a direction parallel to the axis line of the rotatable body 412, and respective first members 426 of a plurality of suction nozzles 424 are fitted in the hold holds 422, respectively, such that each of the first members 426 is movable relative to the rotatable body 412 in an axial direction of the each first member 426 and is not rotatable relative to the body 412. Thus, the suction nozzles 424 are located along a circle whose center is located on the axis line of the body 412 and, in particular in the present embodiment, are equiangularly spaced from one another about the axis line. A second member 428 is fitted in each of the twelve first members 426, such that the second member 428 is movable relative to the each first member 426 in an axial direction of the second member 428 and is not rotatable relative to the same 426.

In addition, the rotatable body 412 has, radially outwardly of the hold holes 422, another group of twelve hold holes 429 which are formed therethrough in a direction parallel to the axis line of the rotatable body 412, and twelve rods 430 are fitted in the hold holes 429 such that each of the rods 430 is movable relative to the rotatable body 412 in a direction parallel to the axis line of the body 412. Each of the twelve rods 430 has the same position as that of a corresponding one of the hold holes 422 in a circumferential direction of the rotatable body 412. An upper end portion of each of the twelve first members 426 that projects upward from the rotatable body 412 is fixed to a corresponding one of the twelve rods 430. Thus, the each first member 426 (or the each suction nozzle 424) is prevented from being rotated relative to the rotatable body 412. Each rod 430 is biased in an upward direction in which the each rod 430 projects from the rotatable body 412, by a compression coil spring 432 as a spring member as an elastic member as a sort of biasing device or member. Thus, each suction nozzle 424 is biased upward by the corresponding spring 432 via the corresponding rod 430. A limit of the upward movement of each rod 430 by the corresponding spring 432 is defined by butting of a large-diameter engaging portion 434 of the each rod 430 on a shoulder surface 436 of the corresponding hold hole 429. A position where the engaging portion 434 of the each rod 430 butts on the shoulder surface 436 corresponds to an tipper-dead position of the corresponding suction nozzle 424. Thus, each rod 430 provides a relative-rotation preventing device which prevents the rotation of the corresponding suction nozzle 424 relative to the rotatable body 412, and an upper-dead-position defining device which defines the upper-dead position of the corresponding suction nozzle 424.

The twelve switch valve devices 420 are provided for the twelve suction nozzles 424, respectively. Each of the switch valve devices 420 includes the same second open/close valve 172 as that of each of the switch valve devices 152 shown in FIG. 5. The rotatable body 412 has, radially inwardly of the first circle along which the suction nozzles 424 are located, twelve first spool holes 440 which are formed therethrough in a direction parallel to the axis line of the rotatable body 4112 and which are located along a second circle whose center is located on the axis line of the rotatable body 412 and, in particular in the present invention, are equiangularly spaced from one another about the axis line. In addition, the rotatable body 412 has, radially inwardly of the first circle, twelve second spool holes 442 which are formed therethrough in a direction parallel to the axis line of the rotatable body 412 and which are located along a third circle whose center is located on the axis line of the rotatable body 412 and whose radius is greater than that of the second circle and, in particular in the present invention, are equiangularly spaced from one another. The rotatable body 412 has the first and second spool holes 440, 442 such that the first spool holes 440 are alternate with the second spool holes 442 in the circumferential direction of the rotatable body 412.

Twelve first spools 408 are fitted in the twelve first spool holes 440, respectively, such that each of the first spools 408 is movable relative to the rotatable body 412 in an axial direction of the each spool 408; and twelve second spools 410 are fitted in the twelve second spool holes 442, respectively, such that each of the second spools 410 is movable relative to the body 412 in an axial direction of the each spool 410. Thus, the first spools 408 and the second spools 410 are located along the two different circles, respectively, whose centers are located on the axis line of the rotatable body 412, and are provided alternately with each other in the circumferential direction of the body 412, inside the circle along which the suction nozzles 424 are located. As shown in FIG. 13, each of the first spools 408 includes two land portions 450, 452 and a small-diameter portion 454, and each of the second spools 410 includes three land portions 456, 458, 460 and two small-diameter portions 462, 464, like each second spool 178 shown in FIG. 8.

Figure 15:
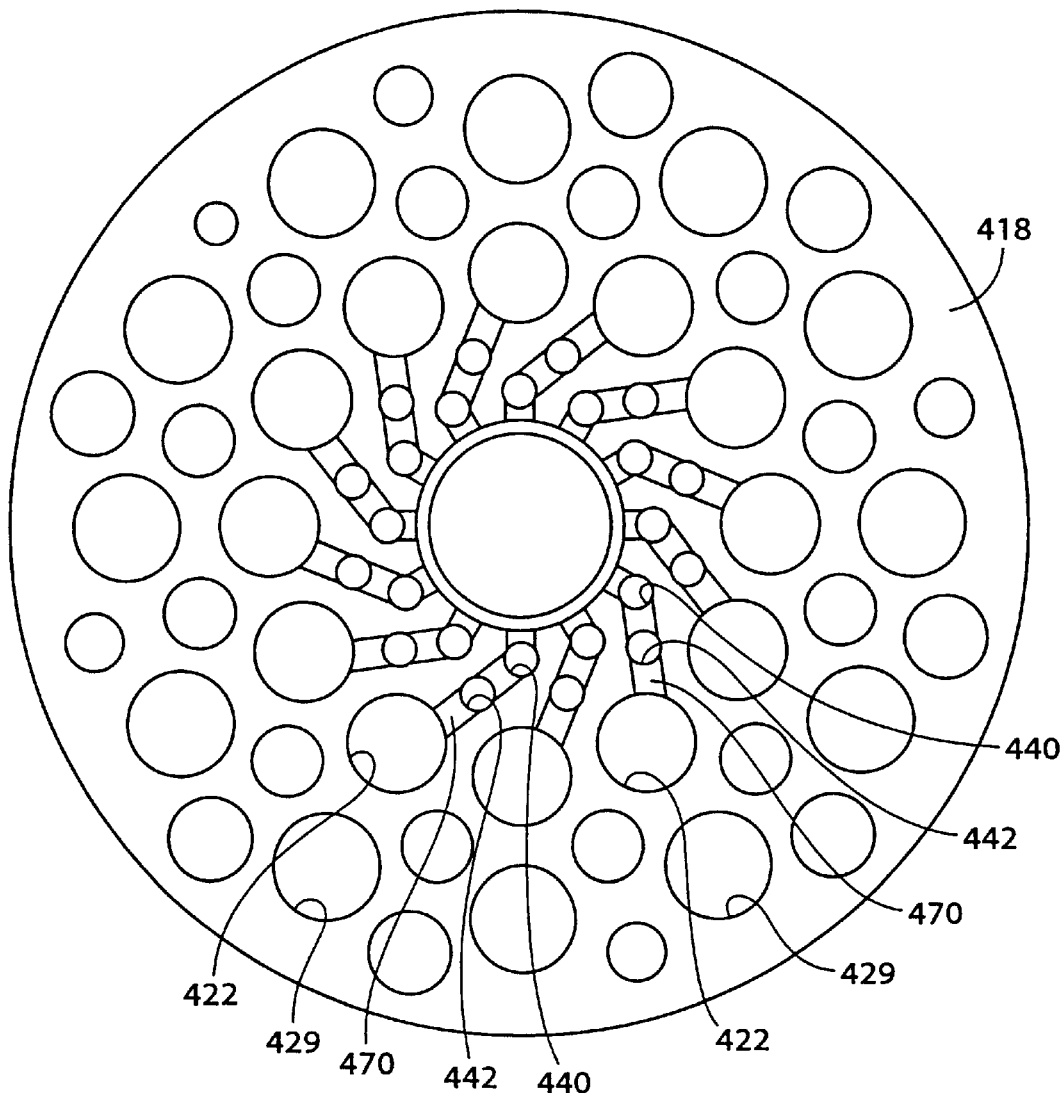
FIG. 15 is a plan view of a second member of the rotatable body of FIG. 14.

The rotatable body 412 has twelve negative-pressure passages 466 and twelve positive-pressure passages 468. As shown in FIG. 15, the second member 418 has twelve negative-pressure-passage forming grooves 470 opening in an upper surface thereof. In the present embodiment, each of the negative-pressure-passage forming grooves 470 has a quadrangular (e.g., rectangular) cross section, and the first member 146 closes respective upper openings of the negative-pressure-passage forming grooves 470 to define the negative-pressure passages 466. The width of each of the passages 466 is smaller than a diameter of each of the first and second spools 408, 410, and the each passage 466 is so formed as to intersect perpendicularly respective axis lines of the corresponding first and second spool holes 440, 442. Each of the negative-pressure passages 466 perpendicularly intersects the respective axis lines of the corresponding first and second spool holes 440, 442, and communicates with the corresponding first open/close valve 404 and the corresponding direction-switch valve 40)6 in series, and opens on one hand in a negative-pressure supply passage 160 of an air-passage forming member 150, and on the other hand in the corresponding hold hole 422.

Figure 16:
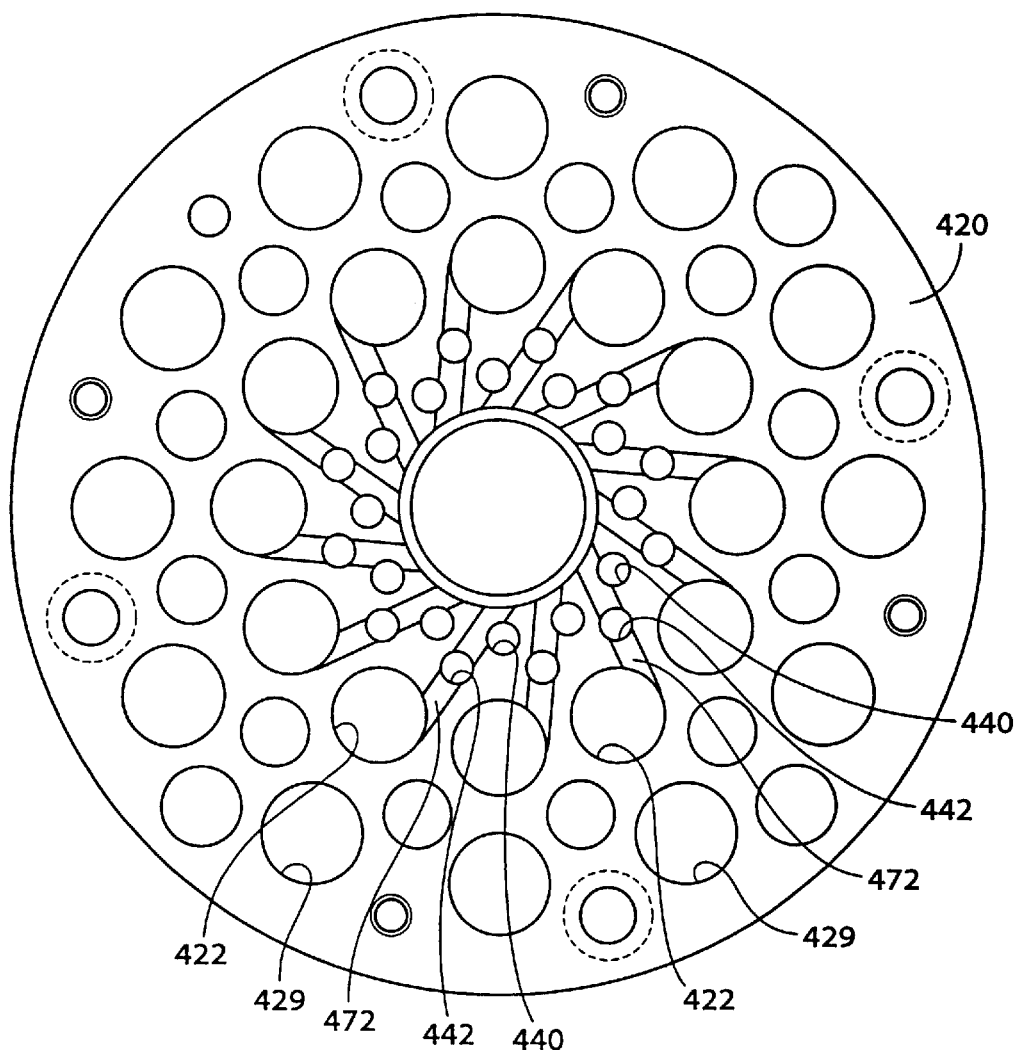
FIG. 16 is a plan view of a third member of the rotatable body of FIG. 14.

As shown in FIG. 16, the third member 420 has twelve positive-pressure-passage forming grooves 472 opening in an upper surface thereof. In the present embodiment, each of the negative-pressure-passage forming grooves 472 has a quadrangular (e.g., rectangular) cross section, and the second member 148 closes respective upper openings of the positive-pressure-passage forming grooves 472 to define the negative-pressure passages 468. The width of each of the positive-pressure passages 468 is smaller than the diameter of each of the first and second spools 408, 410, and the each passage 468 is, as shown in FIGS. 13 and 16, so formed as to intersect perpendicularly the axis line of the corresponding second spool hole 442 and communicate with the corresponding direction-switch valve 406 and additionally communicate with the corresponding first spool hole 440 such that the each passage 468 is partly interfered with by the corresponding first spool 408. Each of the positive-pressure passages 468 opens on one hand in a positive-pressure supply passage 158 of the air-passage forming member 150, and on the other hand in the corresponding hold hole 422. As shown in FIGS. 15 and 16, the rotatable body 412 has a number of holes which are formed for decreasing the weight of the body 412.

Each first spool 408 has the single small-diameter portion 454, but only partly (i.e., not entirely) interferes with the corresponding positive-pressure passage 468. Therefore, each first spool 408 always opens the passage 468, like the first spool 176 of each first open/close valve 170 shown in FIG. 5. Thus, each first open/close valve 404, the corresponding second open/close valve 172, and the corresponding direction-switch valve 406 cooperate with one another to allow and stop the supplying of negative and positive pressures to the corresponding suction nozzle 424, like in the first embodiment shown in FIG. 5.

Each first spool 408 and each second spool 410 are fitted in the corresponding first spool hole 440 and the corresponding second spool hole 442, respectively, without any sealing means provided therebetween. Thus, each positive-pressure passage 468 communicates with the atmosphere and the corresponding negative-pressure passage 466, via a clearance left between the Corresponding first spool 408 and the corresponding first spool hole 440, and via a clearance left between the corresponding second spool 410 and the corresponding second spool hole 442. In addition, each positive-pressure passage 468 is only partly interfered with by a portion of the corresponding first spool 408, and that portion of the first spool 408 is always pressed by the positive pressure supplied through the passage 468. Thus, the positive pressure leaks from the each passage 468 to the atmosphere or the corresponding negative-pressure passage 466, via the clearance left between the first spool 408 and the first spool hole 440. That is, the positive pressure is exerted to only a local portion of an outer circumferential surface of the first spool 408 in a circumferential direction of the spool 408, so that the first spool 408 is pressed against an inner circumferential surface of the first spool hole 440. This, the first spool 408 is prevented from moving downward because of gravity, by a frictional force produced between the outer surface of the spool 408 and the inner surface of the spool hole 440. At each of the upper-dead and lower-dead positions of each first spool 408, the land portion 452 of the each first spool 408 is positioned inside the corresponding positive-pressure passage 468, so that the positive pressure presses the first spool 408 against the inner surface of the corresponding first spool hole 440, thereby preventing the first spool 408 from falling down from the each position because of gravity.

In the state in which the second spool 410 is positioned at the upper-dead position, tile second spool 410 closes the positive-pressure passage 468; and in the state in which the second spool 410 is positioned at the lower-dead position, the second spool 410 opens the positive-pressure passage 468. In the state in which the second spool 410 is positioned at the upper-dead position, the third land portion 460 is positioned inside the positive-pressure passage 468, so that the positive pressure leaks into the atmosphere or the negative-pressure passage 466 and different pressures act on diametrically opposite portions of the second spool 410. This, based on the pressure difference, the second spool 410 is pressed against an inner circumferential surface of the corresponding second spool hole 442, and accordingly is prevented from moving downward because of gravity, by a friction force which is produced between an outer circumferential surface of the spool 410 and the inner surface of the spool hole 442. Since the first spool 408 always opens the positive-pressure passage 468, the positive pressure acts on the second spool 410 being positioned at its upper-dead position, even in the state in which the first spool 408 is positioned at its lower-dead position. Thus, the second spool 410 is prevented from moving downward from its upper-dead position. In the present embodiment, the structural feature that each of the twelve positive-pressure passages 468 is partly interfered with by a corresponding one of the twelve first spools 408, and accordingly the positive pressure acts on respective circumferentially local portions of the one first spool 408 and a corresponding one of the twelve second spools 410, and the positive-pressure passages 468, and the positive-pressure source cooperate with one another to provide a pressure-based spool-downward-movement preventing device as a sort of spool-downward-movement preventing device.

In the state in which the second spool 410 is positioned at its lower-dead position, the second small-diameter portion 464 is positioned inside the positive-pressure passage 468, no pressure difference is obtained which causes the second spool 410 to be pressed against the inner surface of the second spool hole 442. However, the lower-dead position of the second spool 410 is only slightly above the drive member 254 of the returning device 250, and accordingly the second spool 410 can be supported on the drive member 254 if the spool 410 moves downward by gravity. Thus, it is not essentially needed to employ a pressure-based spool-downward-movement preventing device to prevent the second spool 410 from moving downward due to gravity from its lower-dead position. In the present embodiment, the drive member 254 functions as a support member which supports the second spool 410 at its lower-dead position, or a spool-downward-movement preventing member or device.

The downward movement of each suction nozzle 424 and the switching of the first open/close valve 404 and the direction-switch valve 406 are effected when the butting member 480 is moved downward by a butting-member moving device 296, like in the first embodiment. In addition, the butting member 480 is rotated by a butting-member rotating device 280 to an arbitrary rotation phase about the axis line of the rotatable body 412. The butting member 480 includes a projecting portion 481 projecting radially outward from a rotatable shaft 268. The projecting portion 481 includes a nozzle-butting portion 482 which projects downward from a base portion of the projecting portion 481 that is fitted on the rotatable shaft 268. In addition, the projecting portion 481 includes two valve-butting portions 484, 486 which are adjacent to the nozzle-butting portion 482, and between the same portion 482 and the shaft 268. The second valve-butting portion 486 is defined by a portion of the butting portion 480 in which two recesses 488 (FIGS. 13 and 14; the air-passage forming member 150 is not shown in FIG. 14) are formed. When the butting member 480 is rotated, the projecting portion 481 is revolved to a first relative rotation position where the first valve-butting portion 484 is opposed to the first spool 408 of each of the switch valve devices 410 associated with the suction nozzles 424 which suck and hold respective electric components ("ECs") 44, and a second relative rotation position where the second valve-butting portion 486 is opposed to the second spool 410 of the each switch valve device 402. At each of the first and second relative rotation positions of the each switch valve device, the nozzle-butting portion 482 is positioned at a position where the portion 482 is opposed to a corresponding one of the suction nozzles 424.

When the ECs 44 are sucked and held by the suction nozzles 424, the projecting portion 481 of the butting portion 480 is positioned at the first relative rotation position, indicated at solid line in FIG. 14, where the first valve-butting portion 484 is opposed to the first spool 408, the second valve-butting portion 486 is not aligned with the second spool 410, and one of the two recesses 488 is aligned with the second spool 410. When the butting member 480 is moved downward, The nozzle-butting portion 482 moves the corresponding suction nozzle 424 downward against the biasing force of the spring 432, and simultaneously the first valve-butting portion 484 moves the first spool 408 downward against the friction force produced between the spool 408 and the inner surface of the spool hole 440, so that the first open/close valve 404 is switched to the state in which the valve 404 permits the negative pressure to be supplied to the one suction nozzle 424. Since the second valve-butting portion 486 is not aligned with the second spool 410 and the one recess 488 prevents the interference of the projecting portion 481 and the second spool 410, the direction-switch valve 406 is not switched. In addition, the interference of the second spool 410 of the switch valve device associate with another suction nozzle 424 adjacent to the one suction nozzle 424, with the projecting portion 481 of the butting member 480 is prevented by the other recess 488 of the butting member 480.

When the ECs 44 are mounted on the PWB 20, the projecting portion 481 of the butting portion 480 is positioned at the second relative rotation position, indicated at two-dot chain line in FIG. 14, where the second valve-butting portion 486 is opposed to the second spool 410. When the butting member 480 is moved downward, the nozzle-butting portion 482 moves the corresponding suction nozzle 424 downward against the biasing force of the spring 432, and simultaneously the second valve-butting portion 486 moves the second spool 410 downward against the friction force produced between the spool 410 and the inner surface of the spool hole 442, so that the direction-switch valve 4064 is switched to the state in which the valve 404 stops the supplying of the negative pressure to the one suction nozzle 424 and permits the positive pressure to be supplied to the one suction nozzle 424.

In the present EC mounting system, ECs 44 are taken, like in the EC mounting system 46, from EC supplying devices 26, 28, and respective images of all the ECs 44 are simultaneously taken by an image taking device in the form of a CCD camera 88 while the ECs 44 are moved from the EC supplying devices 26, 28 to the PWB 20. In the present embodiment, the first spools 408 and the second spools 410 are provided in the alternate manner as shown in FIG. 14 and accordingly the suction nozzles 424 are provided along a smaller circle than that employed in the EC mounting system 46. Therefore, the image taking device 88 can be more easily constructed and provided. In addition, since the rotatable body 412 can be rotated at increased speeds, the present EC mounting system 400 can enjoy improved EC mounting efficiency.

In each of the illustrated embodiments, the ECs 44 are supplied by the two EC supplying devices 26, 28, and the two prisms 320 are employed. However, it is possible to employ only one of the two EC supplying devices 26, 28 and only one of the two prisms 320.

In each of the illustrated embodiments, the CCD camera 88 takes a front-surface image of each of the ECs 44. However, it is possible to take a silhouette image of each EC 44. For example, each suction nozzle 110, 424 is provided with a light emitter, which emits a light toward a back surface of the EC 44 held by the nozzle, so that the CCD camera 88 takes a silhouette image of the EC 44.

In each of the illustrated embodiments, it is not essentially required that when the ECs 44 are sucked and held by the suction nozzles 110, 424, each of the nozzles 110, 424 is moved to the common EC-suck position (i.e., the single and common rotation position or phase) by the rotation of the rotatable body 90, 412. For example, it is possible that each of the nozzles 110, 424 suck the EC 44 at an arbitrary rotation position or phase. Alternatively, it is possible that when the ECs 44 are sucked and held, the rotatable body 90, 412 be not rotated and each of the nozzles 110, 424 be moved by only the X-axis and Y-axis direction movements of the Y-axis slide 60, to the EC-supply position of one of the EC-supply feeders 30 that is to supply an EC 44 to the each nozzle 110, 424. In the last case, the butting member 272, 480 is rotated to a rotation phase where the nozzle-butting portion 308, 482 is opposed to the each nozzle 110, 424 and the first valve-butting portion 310, 484 is opposed to the first spool 176, 408, and is further moved by the butting-member moving device 296 to move the each nozzle 110, 424 toward the EC 44.

While the present invention has been described in its preferred embodiments, it is to be understood that the present is not limited to the details of the described embodiments and may be embodied with not only the various embodiments described in SUMMARY OF THE INVENTION but also other changes, improvements, and modifications that may occur to one skilled in the art without departing from the spirit and scope of the present invention.

What is claimed is:

1. An electric-component mounting system, comprising:

a board supporting device which supports a printed-wiring board;

a movable member which is movable to an arbitrary position on a movement plane parallel to the printed-wiring board supported by the board supporting device;

a main moving device which moves the movable member;

a rotatable body which is attached to the movable member such that the rotatable body is rotatable about an axis line thereof perpendicular to the movement plane;

a rotatable-body rotating device which rotates the rotatable body about the axis line thereof;

a plurality of suction nozzles which sucks and holds respective electric components and which are supported by the rotatable body such that the suction nozzles are provided along a circle whose center is located on the axis line of the rotatable body and such that each of the suction nozzles is not rotatable relative to the rotatable body and is movable relative to the body in a direction parallel to the axis line of the body;

an engaging member which is rotatable relative to the rotatable body about the axis line of the body and is movable relative to the body in said direction parallel to the axis line of the body, and which includes a nozzle-engaging portion which is engageable with each one of the suction nozzles;

an engaging-member rotating device which rotates the engaging member to at least two rotation phases of the rotatable body at each of which the nozzle-engaging portion of the engaging member is engageable with a corresponding one of the suction nozzles;

an engaging-member moving device which moves the engaging member in said direction parallel to the axis line of the rotatable body, so that at said each of said at least two rotation phases of the rotatable body, the nozzle-engaging portion of the engaging member engages said corresponding one suction nozzle and moves said corresponding one suction nozzle toward the board supporting device; and a control device which controls the main moving device, the rotatable-body rotating device, the engaging-member rotating device, and the engaging-member moving device.

2. The system according to claim 1, wherein the engaging-member rotating device comprises a rotating device which can rotate the engaging member to an arbitrary rotation phase of the rotatable body about the axis line of the body.

3. An electric-component mounting system, comprising:
a board supporting device which supports a printed-wiring board;
a movable member which is movable to an arbitrary position on a movement plane parallel to the printed-wiring board supported by the board supporting device;
a main moving device which moves the movable member;
a rotatable body which is attached to the movable member such that the rotatable body is rotatable about an axis line thereof perpendicular to the movement plane;
a rotatable-body rotating device which rotates the rotatable body about the axis line thereof;
a plurality of suction nozzles which sucks and holds respective electric components and which are supported by the rotatable body such that the suction nozzles are provided along a circle whose center is located on the axis line of the rotatable body and such that each of the suction nozzles is not rotatable relative to the rotatable body and is movable relative to the body in a direction parallel to the axis line of the body;
an engaging member which is rotatable relative to the rotatable body about the axis line of the body and is movable relative to the body in said direction parallel to the axis line of the body, and which includes a nozzle-engaging portion which is engageable with each one of the suction nozzles;
an engaging member rotating device which rotates the engaging member to at least two rotation phases of the rotatable body at each of which the nozzle-engaging portion of the engaging member is engageable with a corresponding one of the suction nozzles;
an engaging member moving device which moves the engaging member in said direction parallel to the axis line of the rotatable body, so that at said each of said at least two rotation phases of the rotatable body, the nozzle-engaging portion of the engaging member engages said corresponding one suction nozzle and moves said corresponding one suction nozzle toward the board supporting device; and
a control device which controls the main moving device, the rotatable-body rotating device, the engaging member rotating device, and the engaging-member moving device,
wherein the engaging member rotating device comprises a rotating device which can rotate the engaging member to an arbitrary rotation phase of the rotatable body about the axis line of the body, and
wherein the control device comprises:
a positioning control portion which can sequentially position, owing to combination of the rotation of the rotatable body by the rotatable-body rotating device and the movement of the movable member by the main moving device, the respective electric components sucked and held by the suction nozzles, at respective positions opposed to respective predetermined locations on the printed-wiring board supported by the board supporting device, such that each of the electric components thus positioned takes an arbitrary rotation position; and
a mounting control portion which controls the engaging-member rotating device to rotate, concurrently with the rotation of the rotatable body, the engaging member to one of said at least two rotation phases that corresponds to one of the suction nozzles that holds the electric component to be mounted next, which controls the engaging-member moving device to move, in said direction parallel to the axis line of the rotatable body, the engaging member to engage said one suction nozzle, so that said one suction nozzle is moved toward the board supporting device and the electric component held by said one suction nozzle is mounted on the printed-wiring board.

4. The system according to claim 1, further comprising a plurality of switch valve devices which are supported by the rotatable body, which correspond to the plurality of suction nozzles, respectively, and each of which comprises at least one switch valve including at least one engageable portion, wherein the engaging member includes at least one valve-engaging portion which is engageable with said at least one engageable portion of the switch valve to switch the switch valve, and wherein the engaging-member rotating device rotates the engaging member to move the valve-engaging portion of the engaging member to a position corresponding to the engageable portion of the switch valve of one of the switch valve devices, and the engaging-member moving device moves the engaging member so that the valve-engaging portion of the engaging member engages the engageable portion of the switch valve of said one switch valve device and thereby switches said one switch valve device.

5. An electric-component mounting system, comprising:
a board supporting device which supports a printed-wiring board;
a rotatable body which is rotatable about an axis line thereof perpendicular to the printed-wiring board supported by the board supporting device;
a main moving device which means at least one of the rotatable body and the board supporting device, relative to the other of the rotatable body and the board supporting device, to an arbitrary position on a movement plane parallel to the printed-wiring board supported by the board supporting device;
a rotatable-body rotating device which rotates the rotatable body about the axis line thereof;
a plurality of suction nozzles which sucks and holds respective electric components and which are supported by the rotatable body such that the section nozzles are provided along a first circle whose center is located on the axis line of the rotatable body and such that, each of the suction nozzles is movable relative to the body in a direction parallel to the axis line of the body;
a nozzle moving device which moves each one of the suction nozzles toward, and away from, the board supporting device; and
a control device which controls the main moving device, the rotatable-body rotating device, and the nozzle moving device, the nozzle moving device comprising
- an engaging member which is rotatable relative to the rotatable body about the axis line of the body and is movable relative to the body in said direction parallel to the axis line of the body, and which includes a nozzle-engaging portion which is engageable with said each one of the suction nozzles,
- an engaging-member rotating device which rotates the engaging member to at least two rotation phases of the rotatable body at each of which the nozzle-engaging portion of the engaging member is engageable with a corresponding one of the suction nozzles, and
- an engaging-member moving device which moves the engaging member in said direction parallel to the axis line of the rotatable body, so that at said each of said at least two rotation phases of the rotatable body, the nozzle-engaging portion of the engaging member engages said corresponding one suction nozzle and moves said corresponding one suction nozzle toward the board supporting device.

6. The system according to, claim 5, wherein the engaging-member rotating device comprises a rotating device which can rotate the engaging member to an arbitrary rotation phase of the rotatable body about the axis line of the body, and wherein the engaging-member moving device moves the engaging member in said direction parallel to the axis line of the rotatable body, so that at said arbitrary rotation phase of the rotatable body, the nozzle-engaging portion of the engaging member engages said corresponding one suction nozzle and moves said corresponding one suction nozzle toward the board supporting device.

7. The system according to claim 5, further comprising a plurality of switch valve devices which are supported by the rotatable body, which correspond to the plurality of suction nozzles, respectively, and each of which comprises at least one switch valve including at least one engageable portion, wherein the engaging member includes at least one valve-engaging portion which is engageable with said at least one engageable portion of the switch valve to switch the switch valve, and wherein the engaging-member rotating device rotates the engaging member to move the valve-engaging portion of the engaging member to a position corresponding to the engageable portion of the switch valve of one of the switch valve devices, and she engaging-member moving device moves the engaging member so that the valve-engaging portion of the engaging member engages the engageable portion of the switch valve of said one switch valve device and thereby switches said one switch valve device.

8. The system according to claim 7, wherein each of the switch valve devices comprises a plurality of switch valves each of which includes said at least one engageable portion, and wherein the valve-engaging portion of the engaging member is selectively engageable, owing to a relative rotation of the engaging member and the rotatable body, with each of the respective engageable portions of the switch valves of said each switch valve device.

9. The system according to claim 8, further comprising an electric-component supplying device which supplies the electric components to the suction nozzles, wherein the switch valves of said each switch valve device comprise a first switch valve and a second switch valve each of which includes said at least one engageable portion, wherein owing to a movement of the engaging member to engage one of the suction nozzles that corresponds to said each switch valve device and thereby move said one suction nozzle toward the electric-component supplying device, the valve-engaging portion of the engaging member engages the engageable portion of the first switch valve, so that in a terminal portion of the movement of the engaging member, the first switch valve is switched to a state in which the first switch valve permits supplying of a negative pressure to said one suction nozzle, and wherein owing to a movement of the engaging member to engage said one suction nozzle and thereby move said one suction nozzle toward the board supporting device, the valve-engaging portion of the engaging member engages the engageable portion of the second switch valve, so that in a terminal portion of the movement of the engaging member, the second switch valve is switched to a state in which the second switch valve stops the supplying of the negative pressure to said one suction nozzle.

10. The system according to claim 9, wherein said each switch valve device is switched, when the second switch valve thereof is switched to said state to stop the supplying of the negative pressure to said one suction nozzle, to a state in which said each switch valve device permits supplying of a positive pressure to said one suction nozzle.

11. The system according to claim 8, wherein the switch valves of said each switch valve device comprises a first switch valve and a second switch valve each of which comprises a spool valve including a spool, and wherein the respective spools of the respective first switch valves of the switch valve devices are provided along a second circle whose center is located on the axis line of the rotatable body and whose diameter is smaller than a diameter of the first circle along which the section nozzles are provided, and the respective spools of the respective second switch valves of the switch valve devices are provided along a third circle whose center is located on the axis line of the rotatable body and whose diameter is smaller than the diameter of the first circle and is different from the diameter of the second circle, such that the respective spools of the respective second switch valves are alternate with the respective spools of the respective first switch valves in a zigzag pattern in a circumferential direction of the rotatable body.

12. The system according to claim 7, wherein said at least one switch valve of each of the switch valve devices comprises a spool valve comprising
- a spool which extends in a direction having an angle relative to a horizontal plane, and which is movable to an upper position thereof and a lower position thereof to control supplying of a negative pressure to one of the suction nozzles that corresponds to said each switch valve device; and
- a spool-downward-movement preventing device which prevents, at at least the upper position of the spool, a downward movement of the spool because of gravity, and permits a downward movement of the spool by engagement of the spool with the valve-engaging portion of the engaging member.

13. The system according to claim 12, wherein the rotatable body has a plurality of spool holes in which the respective spools of the respective spool valves of the switch valve devices are fitted, respectively, and wherein the spool-downward-movement preventing device of said each switch valve device comprises a pressure-based spool-downward-movement preventing device which applies at least one of a positive pressure and a negative pressure, to a local portion of an outer circumferential surface of a corresponding one of the spools in a circumferential direction of said one spool, and thereby presses said one spool against an inner circumferential surface of a corresponding one of the spool holes, so that said one spool is prevented from moving downward, by a frictional force which is produced between the outer circumferential surface of said one spool and the inner circumferential surface of said one spool hole.

14. The system according to claim 7, wherein the switch valves of said each switch valve device comprises a first switch valve and a second switch valve each of which comprises a spool valve including a spool, and wherein the rotatable body has a negative-pressure passage through which a negative pressure is supplied to one of the suction nozzles that corresponds to said each switch valve device and which communicates with the first and second switch valves in series, and a positive-pressure passage through which a positive pressure is supplied to said one suction nozzle and which communicates with the second switch valve, and wherein in a state in which the first and second switch valves are positioned at respective upper positions thereof, the negative-pressure passage is closed by the first switch valve and is opened by the second switch valve, and the positive-pressure passage is closed by the second switch valve, and, when the spool of the first switch valve is moved to a lower position thereof from said state, the negative-pressure passage is completely opened, and when the spool of the second switch valve is additionally moved to a lower position thereof, the negative-pressure passage is closed and the positive-pressure passage is opened.

15. The system according to claim 14, wherein the positive-pressure passage communicates with the spool hole of the first switch valve, such that the positive-pressure passage is partly interfered with by the spool of the first switch valve, and a clearance between an outer circumferential surface of the spool of the first switch valve and an inner circumferential surface of the spool hole of the first switch valve communicates with a space whose pressure is lower than the positive pressure supplied through the positive-pressure passage, and wherein the positive-pressure passage communicates with the spool hole of the second switch valve, and a clearance between an outer circumferential surface of the spool of the second switch valve and an inner circumferential surface of the spool hole of the second switch valve communicates with a space whose pressure is lower than the positive pressure supplied through the positive-pressure passage.

16. The system according to claim 12, wherein the spool-downward-movement preventing device comprises a friction ring which is supported by the rotatable body such that the friction ring is not movable relative to the rotatable body and is interference-fitted on the spool, and which prevents the downward movement of the spool, owing to a frictional force which is produced between the spool and the friction ring.

17. The system according to claim 9, wherein the first and second switch valves include, in addition to respective first engageable portions as the respective engageable portions thereof which are engageable with the valve-engaging portion of the engaging member, respective second engageable portions, and wherein the system further comprises a returning device which is simultaneously engageable with the second engageable portions of the first and second switch valves, to simultaneously return the first and second switch valves to respective initial states thereof in which the first and second switches cooperate with each other to stop the supplying of the negative pressure, and the supplying of the positive pressure, to said one suction nozzle.

18. An electric component mounting system, comprising:
a board supporting device which supports a printed-wiring board;
a movable member which is movable to an arbitrary position on a movement plane parallel to the printed-wring board supported by the board supporting device;
a main moving device which moves the movable member;
a rotatable body which is attached to the movable member such that the rotatable body is rotatable about an axis line thereof perpendicular to the movement plane;
a rotatable body rotating device which rotates the rotatable body about the axis line thereof,
a plurality of suction nozzles which sucks and holds respective electric components and which are supported by the rotatable body at respective positions offset from the axis line of the rotatable body;
a nozzle moving device which moves at least one of (a) each of the suction nozzles and (b) the board supporting device, toward, and away from, the other of said each suction nozzle and the board supporting device, in a direction perpendicular to the movement plane;
an image taking device which takes respective images of the electric components held by the suction nozzles; and
a control device which obtains information by processing the images of the electric components taken by the image taking device, and controls, based on the obtained information, at least one of the main moving device, the rotatable-body rotating device, and the nozzle moving device,
wherein the main moving device comprises a slide which is movable in an X-axis direction parallel to the movement plane, and moves, on the slide, the movable member in a Y-axis direction parallel to the movement plane and perpendicular to the X-axis direction, wherein the image taking device is attached together with the rotatable body to the movable member, and
wherein the system further comprises a reflecting device which is supported by the slide such that the reflecting device is opposed to a path of movement of the rotatable body and the image taking device, and which causes the respective images of the electric components held by the suction nozzles, to be incident to the image taking device.

19. The system according to claim 18, wherein the control device comprises an error-elimination control portion which determines, based on the information obtained by processing the images of the electric components taken by the image taking device, at least one position error of the electric component held by each of the suction nozzles, and controls at least one of the main moving device and the rotatable-body rotating device to eliminate the determined position error, and thereby eliminate at least one position error of the electric component relative the printed-wiring board on which the electric component is to be mounted.

20. An electric-component mounting system, comprising:
a board supporting device which supports a printed-wiring board;
a movable member which is movable to an arbitrary position on a movement plane parallel to the printed-wiring board supported by the board supporting device;
a main moving device which moves the movable member;
a rotatable body which is attached to the movable member such that the rotatable body is rotatable about an axis line thereof perpendicular to the movement plane;
a rotatable-body rotating device which rotates the rotatable body about the axis line thereof;
a plurality of suction nozzles which sucks and holds respective electric components and which are supported by the rotatable body such that the suction nozzles are provided along a circle whose center is located on the axis line of the rotatable body and such that each of the suction nozzles is not rotatable relative to the rotatable body and is movable relative to the body in a direction parallel to the axis line of the body;

an engaging member which is rotatable relative to the rotatable body about the axis line of the body and is movable relative to the body in said direction parallel to the axis line of the body, and which includes a nozzle-engaging portion which is engageable with each one of the suction nozzles;

an engaging-member rotating device which rotates the engaging member to at least two rotation phases of the rotatable body at each of which the nozzle-engaging portion of the engaging member is engageable with a corresponding one of the suction nozzles and is not engageable with the other suction nozzles;

an engaging-member moving device which moves the engaging member in said direction parallel to the axis line of the rotatable body, so that at said each of said at least two rotation phases of the rotatable body, the nozzle-engaging portion of the engaging member engages said corresponding one suction nozzle and moves said corresponding one suction nozzle toward the board supporting device, and disengages from said corresponding one suction nozzle; and a control device which controls the main moving device, the rotatable-body rotating device, the engaging-member rotating device, and the engaging-member moving device.

21. The system according to claim 18, wherein the control device controls the image taking device and the main moving device, such that the image taking device simultaneously takes, during a movement of the rotatable body caused by the movement of the movable member by the main moving device, the respective images of the electric components held by the suction nozzles, while the image taking device is moved with the rotatable body.

* * * * *